United States Patent
Ikeda et al.

(10) Patent No.: US 7,629,534 B2
(45) Date of Patent: Dec. 8, 2009

(54) CONTACT MEMBER, CONNECTING METHOD OF THE CONTACT MEMBER, AND SOCKET

(75) Inventors: Yuko Ikeda, Shinagawa (JP); Toshihiro Kusagaya, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 12/081,618

(22) Filed: Apr. 18, 2008

(65) Prior Publication Data

US 2009/0166056 A1    Jul. 2, 2009

(30) Foreign Application Priority Data

Dec. 27, 2007   (JP) .............................. 2007-338000

(51) Int. Cl.
*H01R 4/18* (2006.01)
(52) U.S. Cl. ....................................... 174/94 R; 439/66
(58) Field of Classification Search ............... 174/94 R; 439/66
See application file for complete search history.

(56) References Cited

U.S. PATENT DOCUMENTS 4,961,709 A * 10/1990 Noschese ...................... 439/66
5,184,962 A * 2/1993 Noschese ...................... 439/66

FOREIGN PATENT DOCUMENTS

JP          2005-129428          5/2005

* cited by examiner

*Primary Examiner*—Chau N Nguyen
(74) *Attorney, Agent, or Firm*—IPUSA, PLLC

(57) ABSTRACT

A contact member inserted in a piercing hole of a socket provided between a first contacted member and a second contacted member facing each other, the contact member includes a first contact part configured to come in contact with a first pad formed in the first connected member; a second contact part configured to come in contact with a second pad formed in the second connected member; and a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part; the spiral cylindrical part having an external circumferential surface coming in contact with an inside wall of the piercing hole.

11 Claims, 25 Drawing Sheets

CONTACT MEMBER, CONNECTING METHOD OF THE CONTACT MEMBER, AND SOCKET

BACKGROUND OF THE INVENTION

1. Field of the Invention

The present invention generally relates to contact members, connecting methods of the contact members, and sockets. More specifically, the present invention relates to a contact member configured to electrically connect a first connected member and a second connected member facing each other, a connecting method of the contact member, and a socket.

2. Description of the Related Art

Contact members are electrically connected to plural electrodes of an electronic device, an inspection device, or a socket for an IC package in a state where the contact members are arranged to correspond to the electrodes. Here, the socket for the IC package is configured to mount in an exchangeable manner an LGA (Land Grid Array) type or a BGA (Ball Grid Array) type IC package on a printed wiring board.

A telescopic contact member is suggested in Japanese Laid-Open Patent Application Publication No. 2005-129428. The telescopic contact member suggested in Japanese Laid-Open Patent Application Publication No. 2005-129428 is inserted into a piercing hole of a socket (board) so that an external circumference of the socket is engaged with an inside wall of the socket. A contact part of the center part of the contact member projects upward and downward from the socket.

This contact member has a spiral spring structure where a belt shaped conductive metal member is triple-wound. Therefore, when the contact part of the center part of the contact member comes in contact with an electrode of an electronic device or a printed wiring board, the spiral wound conductive metal member is compressed in up and down directions and a contact pressure is applied to the electrode based on a reaction force.

However, because the above-mentioned contact member has a structure where the belt shape conductive metal member is triple-wound, electronic signals flow in a longitudinal direction (circumferential direction) of the spiral shaped conductive metal member.

Accordingly, inductance at an electric current-carrying time is increased. Furthermore, because a large number of the contact members corresponding to the number of the electrodes is provided, the sum of the entire inductance is greatly increased.

SUMMARY OF THE INVENTION

Accordingly, embodiments of the present invention may provide a novel and useful contact member, a connecting method of the contact member, and a socket solving one or more of the problems discussed above.

More specifically, the embodiments of the present invention may provide a contact member inserted in a piercing hole of a socket provided between a first contacted member and a second contacted member facing each other, the contact member including:

a first contact part configured to come in contact with a first pad formed in the first connected member;

a second contact part configured to come in contact with a second pad formed in the second connected member; and a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part; the spiral cylindrical part having an external circumferential surface coming in contact with an inside wall of the piercing hole;

wherein a compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length.

The embodiments of the present invention may provide a connecting method of a contact member, the contact member including a first contact part configured to come in contact with a first pad formed in a first connected member;

a second contact part configured to come in contact with a second pad formed in a second connected member; and a spiral cylindrical part formed in a spiral manner with respect to an axial line connecting the first contact part and the second contact part, the spiral cylindrical part having one end configured to hold the first contact part, another end configured to hold the second contact part, and an external circumferential surface coming in contact with an inside wall of the piercing hole;

the connecting method including:

a step of inserting the spiral cylindrical part into the piercing hole of the socket so that the external circumferential surface of the spiral cylindrical part comes in contact with the inside wall of the piercing hole, the first contact part projects at one side of the socket, and the second contact part projects at another side of the socket;

a step of making the first contact part come in contact with a first pad formed in the first connected member;

a step of making the second contact part come in contact with a second pad formed in the second connected member; and a step of applying a compression load in the axial line direction to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length.

The embodiments of the present invention may provide a socket provided between a first contacted member and a second contacted member facing each other, the socket having a piercing hole where a contact member is inserted, the piercing hole piercing between the first contacted member and the second contacted member, the contact member including:

a first contact part configured to come in contact with a first pad formed in the first connected member;

a second contact part configured to come in contact with a second pad formed in the second connected member; and a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part; the spiral cylindrical part having an external circumferential surface coming in contact with an inside wall of the piercing hole;

wherein a compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length.

According to the embodiments of the present invention, a compression load in an axial line is added to the first contact part and the second contact part. As a result of this, the small diameter curved part situated inside of a spiral cylindrical part is deformed outwardly so as to come in contact with a large diameter curved part situated outside the small diameter part. Because of this, it is possible to electrically connect the first pad and the second pad to each other with a shortest length. Hence, it is possible to make impedance at the time of mounting small and reduce electric loss.

Other objects, features, and advantages of the present invention will become more apparent from the following detailed description when read in conjunction with the accompanying drawings.

DETAILED DESCRIPTION OF THE PREFERRED EMBODIMENTS

A description is given below, with reference to the FIG. 1 through FIG. 23B of embodiments of the present invention.

First Embodiment

Figure 1:
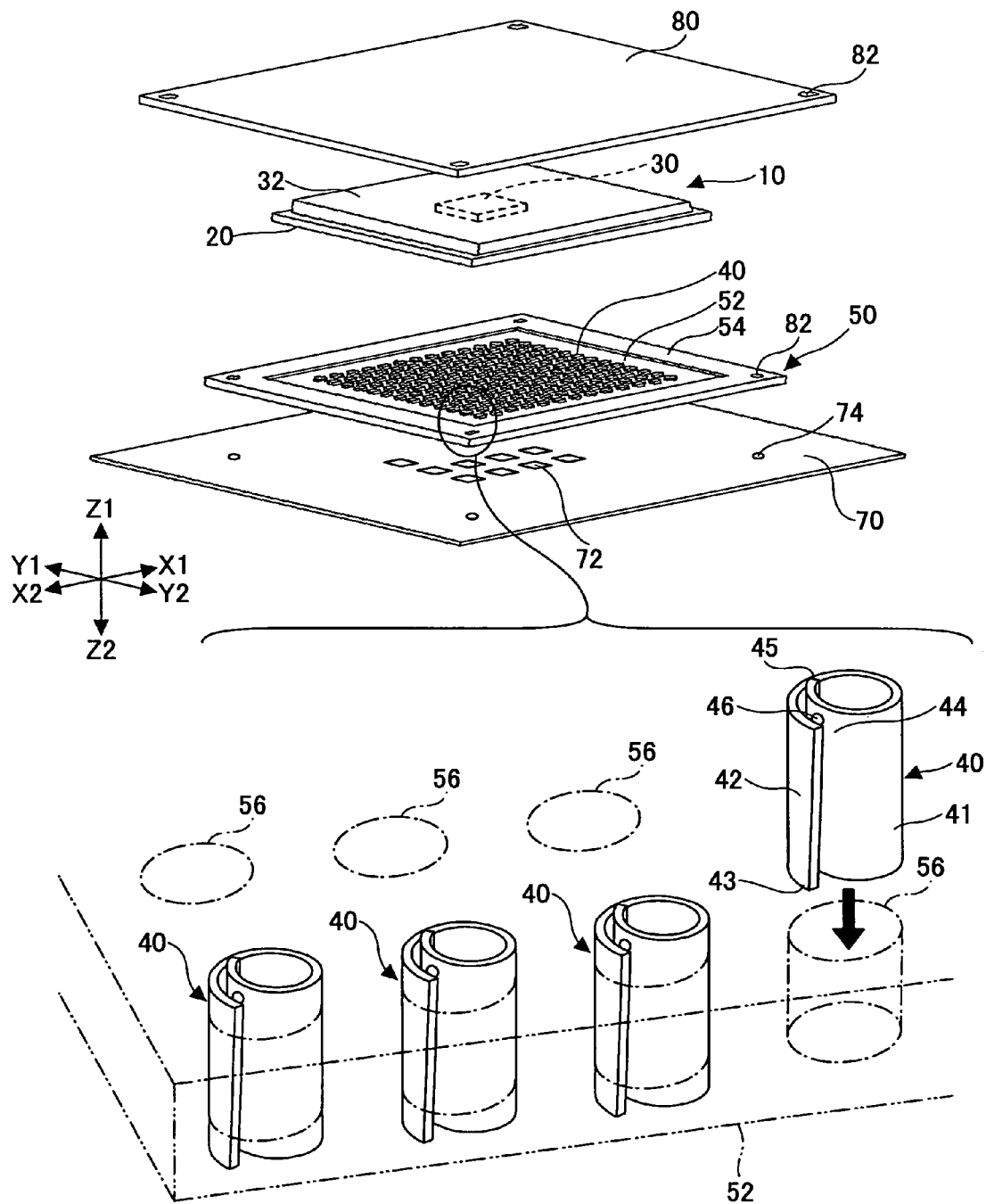
FIG. 1 is an exploded perspective view of a socket for an LGA type IC package using a contact member of a first embodiment of the present invention.
Figure 2:
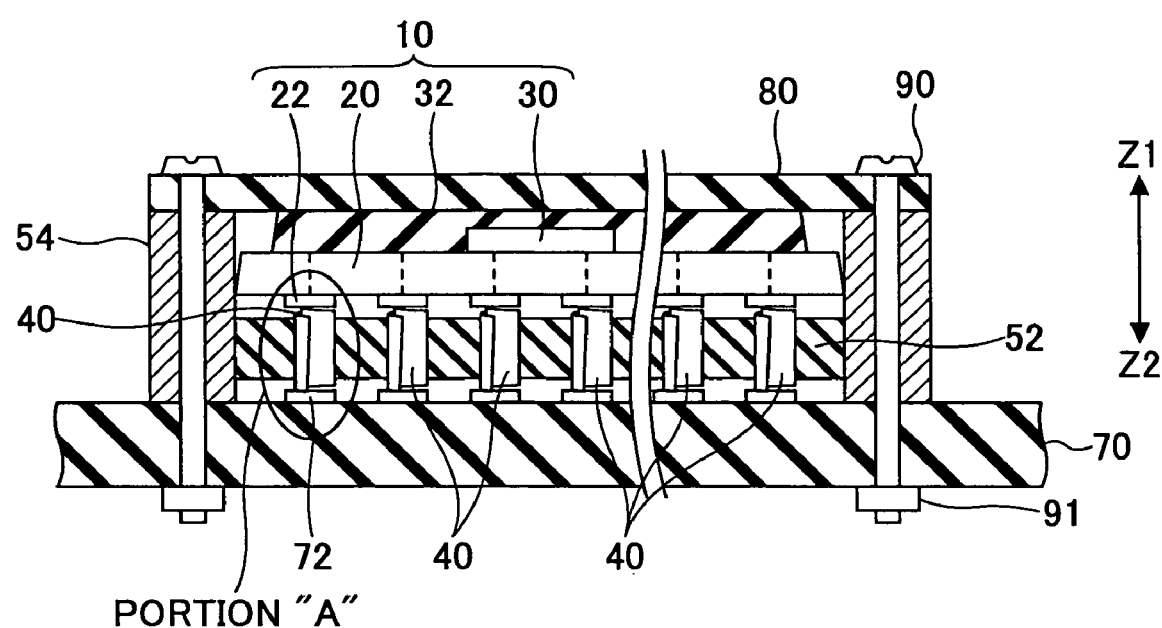
FIG. 2 is a side cross-sectional view showing the socket in use.

FIG. 1 is an exploded perspective view of a socket 50 for an LGA type IC package using a contact member of a first embodiment of the present invention. FIG. 2 is a side cross-sectional view showing the socket 50 in use.

Referring to FIG. 1 and FIG. 2, in an LGA (Land Grid Array) type IC package (hereinafter "IC package") 10, an IC chip 30 is mounted on a board 20. The periphery of the IC chip 30 (including an upper surface and side surfaces of the IC chip 30) is sealed by a sealing resin member 32.

Furthermore, the socket 50 for an IC package (hereinafter "socket 50") is provided under the board (a second connected member) 20 of the IC package 10. In the socket 50, plural contact members 40 are arranged in X and Y directions at designated pitches so as to face a connected surface formed in a lower surface of the board 20.

In addition, a printed wiring board (a first connected member) 70 is provided under the socket 50 so that a connected surface situated at an upper side faces the socket 50. A cover member 80 is provided above the IC package 10 so as to cover an upper surface of the IC chip 30.

The socket 50 includes a base plate 52 and a frame 54. The base plate 52 has a plane plate shaped configuration and is made of an insulation material such as a resin material. The frame 54 is provided so as to surround the base plate 52.

The socket 50 is used when the IC package 10 is mounted on the printed wiring board 70. The socket 50 is provided between the printed wiring board 70 and the IC package 10 so that an end part of the contact member 40 projecting to a lower surface of the IC package 10 and a second pad 72 formed on the printed wiring board 70 are electrically connected to each other.

The base plate 52 is supported by the rectangular shaped frame 54 so that an upper surface and a lower surface of the base plate 52 form horizontal surfaces. Circumferential edge parts in X and Y directions of the frame 54 having the rectangular shaped configuration are rigid.

In addition, piercing holes 56 are provided in the base plate 52. The piercing holes 56 are arranged in the X and Y directions at designated pitches in the base plate 52. The piercing holes 56 are arranged above plural second pads 72 attached to the printed wiring board 70. The piercing holes 56 and the second pads 72 face each other so that axial lines passing through the centers in the up and down directions of the piercing holes 56 pass through the centers of the corresponding second pads 72.

Figure 3A:
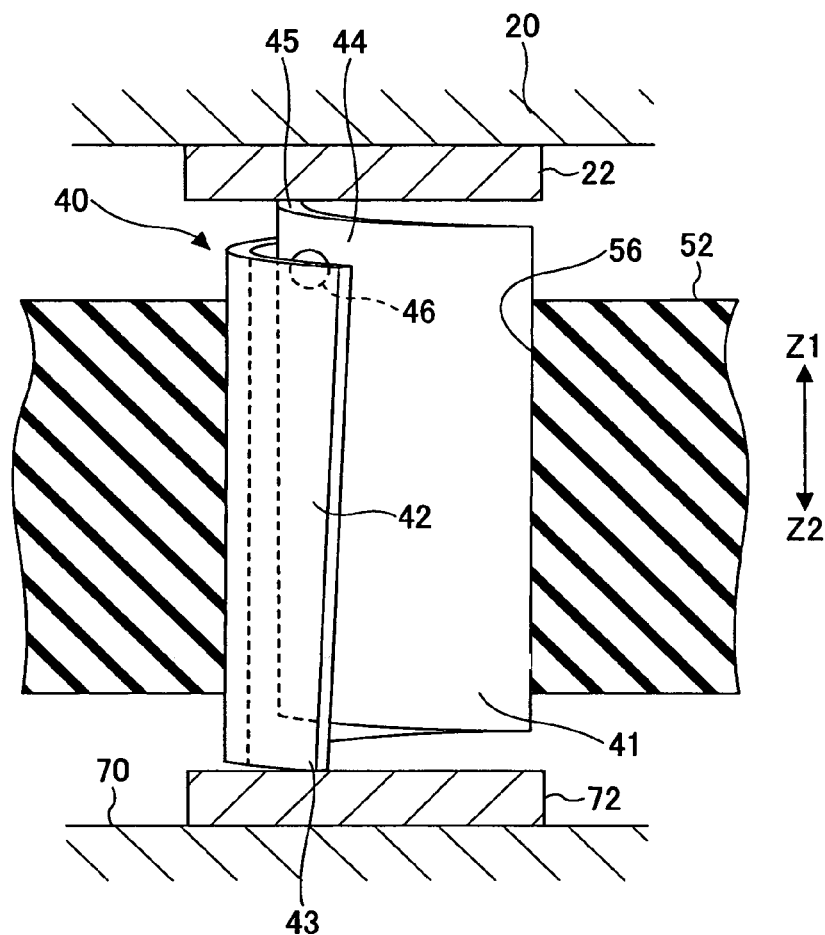
FIG. 3A is an expanded view of a portion A shown in FIG. 2.
Figure 3B:
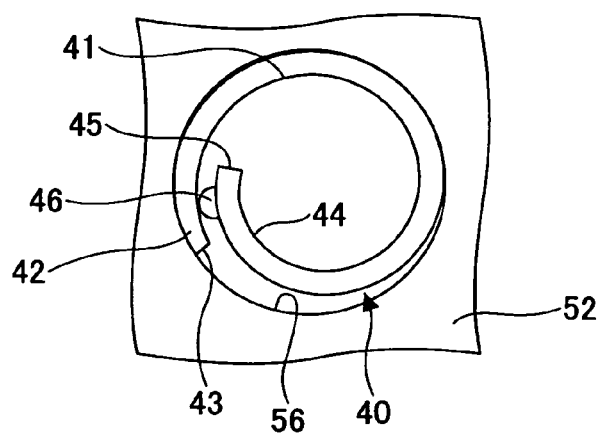
FIG. 3B is a view seen from an upper part where a contact member 40 is inserted into a piercing hole.

FIG. 3A is an expanded view of a portion A shown in FIG. 2. FIG. 3B is a plan view where the contact member 40 is inserted into the piercing hole 56.

Referring to FIG. 3A and FIG. 3B, the contact member 40 is made of a metal material having conductivity and spring properties, such as phosphor bronze or stainless steel. The contact member 40 includes a spiral cylindrical part 41, a large diameter curved part 42, a second contact part 43, a small diameter part 41, and a first contact part 45.

The spiral cylindrical part 41 is formed in a spiral shape and generates a spring force in the up and down directions (Z1 and Z2 directions). The large diameter curved part 42 is situated outside the spiral cylindrical part 41 and has a large radius of curvature. The second contact part 43 is formed at a lower end of the large diameter curved part 42.

The small diameter curved part 44 is formed inside the large diameter curved part 42 and has a radius of curvature smaller than that of the large diameter curved part 42. The first contact part 45 is formed at an upper end of the small diameter curved part 44.

The contact members 40 are inserted into the corresponding piercing holes 56 of the base plate 52. As a result, the external circumference of the large diameter curved part 42 comes in contact with an inside wall of the piercing hole 56 so that the spiral cylindrical part 41 is held in the piercing hole 56 due to friction based on contact pressure of the external circumferential surface of the large diameter curved part 42. The small diameter part 44 is situated inside and separated from an internal circumference of the large diameter curved part 42.

Furthermore, the second contact part 43 projects downward from the piercing hole 56 and the first contact part 45 projects upward from the piercing hole 56. Because of this, when a compression load in the up and down directions is applied to the contact member 40, an inclination angle of the spiral cylindrical part 41 becomes small in order to be changed to an angle close to a horizontal, and the small diameter curved part 44 is pushed down relative to the large diameter part 42. Hence, the contact member 40 can be in contact in the up and down directions.

Here, steps of mounting the IC package 10 on the printed wiring board 70 are discussed.

As shown in FIG. 1 and FIG. 2, first, the socket 50 is mounted on the printed wiring board 70.

Next, the IC package 10 is provided inside the frame 54 of the socket 50 so as to be mounted on the base plate 52.

Then, the cover member 80 is mounted on the IC package 10.

After this, bolts 90 are inserted into engaging holes 82 formed at corner parts of the cover member 80. In addition, the bolts 90 are inserted into engaging holes 58 formed at corner parts of the frame 54 of the socket 50 and engaging holes 74 of the printed wiring board 70. Then, nuts 91 are screw-fixed to lower ends of the bolts 90 projecting through the lower surface of the printed wiring board 70.

As a result of this, the components forming the mounting structure of the IC package 10 are connected to each other in a unified structure. The IC package 10 is sandwiched between the cover member 80 and the base plate 52 and mounted on the printed wiring board 70 via the socket 50.

In this mounting structure, the first contact parts 45 formed at the upper end of the contact members 40 come in contact with corresponding first pads 22 (not shown in FIG. 1) formed on the lower surface of the board 20. In addition, the second contact parts 43 formed at the lower end of the contact members 40 come in contact with the corresponding second pads 72 formed on the printed wiring board 70.

As shown in FIG. 3A and FIG. 3B, when the compression load is applied to the contact member 40 in the up and down directions (Z1 and Z2 directions in FIG. 3A), the small diameter part 44 goes down and deforms to an expanded diameter side in a radial direction so that the small diameter curved part 44 comes in contact with an internal surface of the large diameter curved part 42 and electric conductivity can be established.

Furthermore, a projection 46 for connection having a semi-spherical shaped configuration (third contact part 46) projects from the external circumference of the small diameter curved part 44. This projection 46 for connection comes in point-contact with the internal circumference surface of the large diameter curved part 42.

With this structure, the contact member 40 is shortened along a line connecting in the up and down directions the second contact part 43 of the large diameter curved part 42 and the first contact part 45 of the small diameter curved part 44 to each other.

Because of this, with this structure, plural first pads 22 and the corresponding second pads 72 are electrically connected to each other with shortest lengths. Here, the first pads 22 of the IC chip 30 come in contact with the corresponding first contact parts 45 formed at the upper end of the contact members 40. The second pads 72 on the printed wiring board 70 come in contact with the second contact parts 43 formed at the lower ends of the contact members 40. Because of this, in the contact member 40, inductance at the time of mounting can be made small so that electrical loss can be reduced.

In addition, it is possible to separate the IC package 10 from the printed wiring board 70 by unscrewing the bolts 90 and the nuts 91. As a result of this, because the compression load in the up and down directions in the contact member 40 is eliminated, the second contact part 43 and the first contact part 45 move vertically apart (are extended) again so that the projection 46 for connection provided at the small diameter curved part 44 is separated from the internal circumferential surface of the large diameter curved part 42.

Here, a manufacturing method of the above-discussed contact member 40 is discussed with reference to FIG. 4A through FIG. 4B.

Figure 4A:
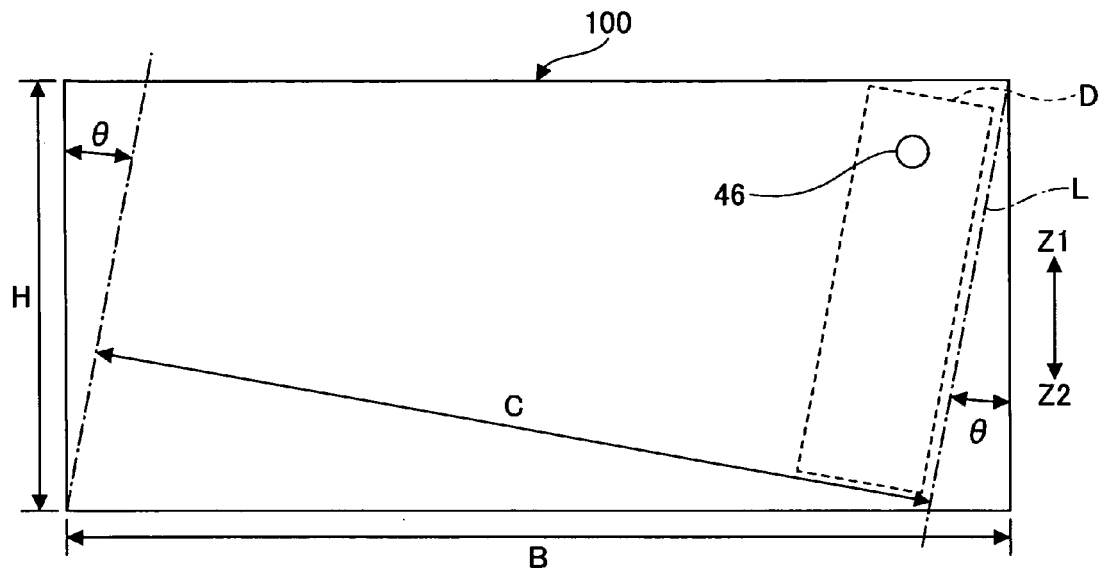
FIG. 4A is a front view showing a belt shaped member 100 where the contact member 40 is expanded.

Here, FIG. 4A is a front view showing the belt shaped member 100 in a state where the contact member 40 is expanded vertically. FIG. 4B is a side view of the belt shaped member 100. FIG. 5A is a perspective view of the curved contact member 40. FIG. 5B is a plan view of the curved contact member 40.

Figure 4B:
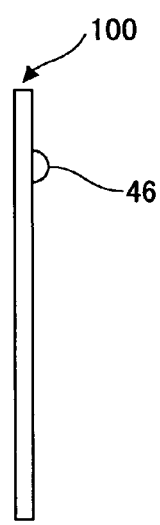
FIG. 4B is a side view of the belt shaped member 100.
Figure 5A:
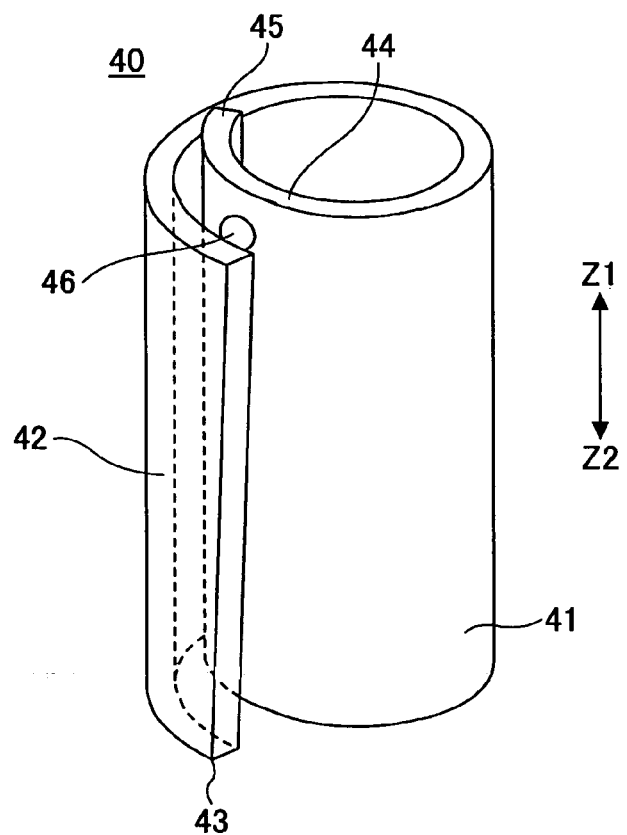
FIG. 5A is a perspective view of the curved contact member 40.
Figure 5B:
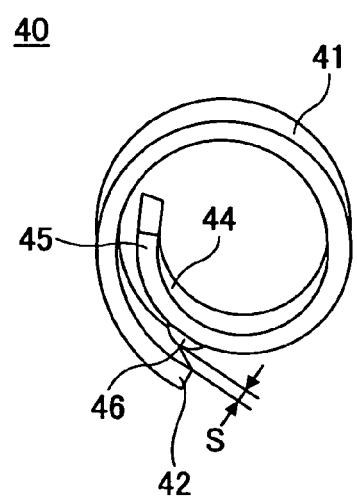
FIG. 5B is a plan view of the curved contact member 40.

As shown in FIG. 4A and FIG. 4B, first, a metal plate working is applied to a plate made of a metal material having conductivity and spring properties, such as phosphor bronze or stainless steel. Alternatively, a belt shaped metal material wound in a roll is cut into parts having designated lengths. As a result of this, the belt shaped member 100 is formed. This belt shaped member 100 is the contact member 40 developed in a planar plate shape.

The height H and width B of the belt shaped member 100 are determined based on the diameter of the piercing hole 56 or the depth of the piercing hole 56 (namely, thickness of the base plate 52).

In next step, the projection 46 for connection is formed on the belt shaped member 100 by a pressing process. The projection 46 for connection has a semi-spherical shaped configuration and the top of the projection 46 works as a contact part. A configuration other than the semi-spherical shaped configuration, for example, a trapezoidal shaped configuration or a conical shaped configuration, may be selected as the configuration of the projection 46.

A position where the projection 46 is formed is in an area D where the overlapped large diameter curved part 42 and the small diameter curved part 44 face each other.

The area D is a rectangular shaped area and includes a circumferential direction area and a height direction area. Here, the circumferential direction area is an area where the small diameter curved part 44 is operated in the circumferential direction with respect to the large diameter curved part 42, which is pressed and held by the internal circumferential surface of the piercing hole 56. The height direction area is an area where the small diameter part 44 moves down due to the pressing load in the up and down directions. It is preferable to set the area D by considering a range of a process error.

In a next step, as shown in FIG. 5A and FIG. 5B, the belt shaped member 100 is curved in a spiral manner. At this time, the radius of curvature in a process for making the spiral is made small so that one end (right end in FIG. 4A) in a longitudinal direction of the belt shaped member 100 having the projection 46 has a small diameter.

In addition, the radius of curvature in a process for making the spiral is made large so that another end (left end in FIG. 4A) in the longitudinal direction of the belt shaped member 100 has a large diameter. In addition, the radius of curvature used in the process for making the spiral is set so that both ends in the longitudinal direction of the belt shaped member 100 overlap with different spiral diameters.

When the process for making the spiral is performed, the belt shaped member 100 is formed in a spiral manner in a diameter direction and in an inclined manner with a designated inclination angle relative to an axial direction. Therefore, it is possible to realize elastic deformation in the diameter direction and expansion and contraction in the axial direction of the belt shaped member 100.

Because of this, when the process for making the spiral is applied to the belt shaped member 100, for example, the belt shaped member 100 is curved in a roll in the circumferential direction (C direction in FIG. 4A) where an axial line L is a centerline. The axial line L is inclined at a designated angle (angle θ shown in FIG. 4A) relative to the belt shaped member 100.

When the process for making the spiral is completed, a gap S is formed between a top part of the projection 46 and an internal circumferential surface of the large diameter curved part 42. Because of this, the large diameter curved part 42 and the small diameter curved part 44 do not come in contact with each other. This gap S remains even where the contact member 40 is inserted in the piercing hole 56 of the socket 50 (base plate 52).

Accordingly, as shown in FIG. 2, when the IC package 10 is mounted on the printed wiring board 70 using the socket 50, in the contact member 40 inserted in the piercing hole 56 of the socket 50, the large diameter curved part 42 and the small diameter curved part 44 are compressed in the up and down directions (Z1 and Z2 directions) by a compression load.

During a process where the spiral cylindrical part 41 is changed from being inclined to being horizontal, the small diameter part 44 goes down to the large diameter curved part 42 pressed and held by the internal circumferential surface of the piercing hole 56 and the small diameter part 44 deforms and the diameter of the small diameter part 44 increases outwardly. As a result of this, the projection 46 provided on the small diameter curved part 44 comes in point contact with the large diameter curved part 42.

In addition, due to a spring force (elastic restoring force) based on an elastic deformation of the spiral cylindrical parts 41, the first contact parts 45 of the contact members 40 are pressed by the corresponding first pads 22 of the board 20. The second contact parts 43 of the contact members 40 are pressed by the corresponding second pads 72 provided on the printed wiring board 70.

In other words, when mounted as shown in FIG. 3A, the spiral cylindrical part 41 of the contact member 40 is elastically deformed from being inclined to being substantially horizontal, so that contact pressure on the first pads 22 and the second pads 72 can be generated.

Next, a modified example 1 of the first embodiment of the present invention is discussed with reference to FIG. 6A and FIG. 6B. In the following explanation, parts that are the same as the parts discussed in the first embodiment of the present invention are given the same reference numerals, and explanation thereof is omitted.

Figure 6A:
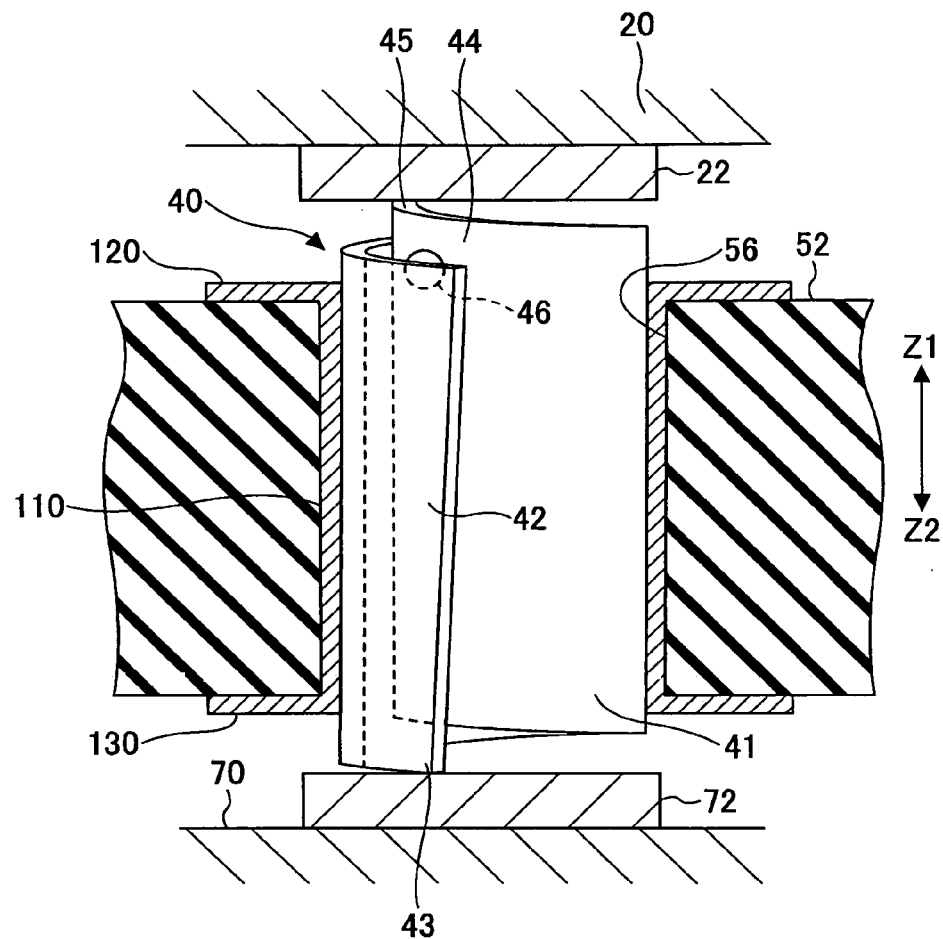
FIG. 6A is an expanded view of a modified example 1 of the first embodiment of the present invention.

Here, FIG. 6A is an expanded view of the modified example 1 of the first embodiment of the present invention. FIG. 6B is a plan view of the modified example 1 of the first embodiment of the present invention.

Figure 6B:
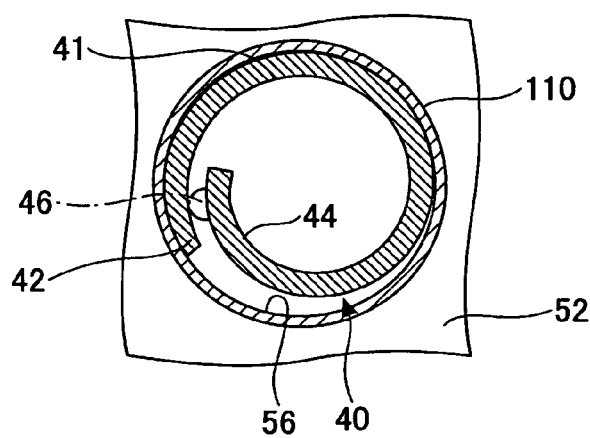
FIG. 6B is a plan view of the modified example 1 of the first embodiment of the present invention.

Referring to FIG. 6A and FIG. 6B, in the modified example 1, a conductive layer 110 extending in Z1 and Z2 directions is formed on the entire internal circumferential surface of the piercing hole 54 by a plating method. A through hole is formed in the conductive layer 110. The conductive layer 110 is electrically connected to a wiring pattern 120 situated on an upper surface of the base plate 52 and a wiring pattern 130 situated on a lower surface of the base plate 52.

Accordingly, when the IC package 10 is mounted on the printed wiring board 70 using the socket 50, the first contact part 45 formed at the upper ends of the contact members 40 come in contact with the corresponding first pads 22 formed on the lower surface of the board 20. The second contact parts 43 formed at the lower end of the contact members 40 come in contact with the corresponding second pads 72 formed on the printed wiring board 70.

Thus, in the contact member 40, by applying the compression load in the up and down directions (Z1 and Z2 directions), the small diameter curved part 44 goes down and deforms to the expanded diameter side in the radial direction and thereby the top part of the projection 46 of the small diameter curved part 44 comes in contact with the internal surface of the large diameter curved part 42. As a result of this, electric conductivity can be established.

On the other hand, the large diameter curved part 42 comes in contact with the conductive layer 110 formed on an internal circumferential surface of the piercing hole 56 so that the contact member 40 inserted in the piercing hole 56 of the socket 50 is reset.

Furthermore, the small diameter curved part 44 goes down and the diameter of the small diameter curved part 44 expands outwardly. Hence, the projection 46 provided on the small diameter curved part 44 comes in point contact with the internal circumferential surface of the large diameter curved part 42.

With this structure, the contact member 40 is securely shortened along a line connecting in the up and down directions the second contact part 43 of the large diameter curved part 42 to the first contact part 45 of the small diameter curved part 44. The first pads 22 of the IC chip 30 are electrically connected to the wiring patterns 120 and 130 formed at the upper surface and the lower surface of the base plate 52.

Figure 7A:
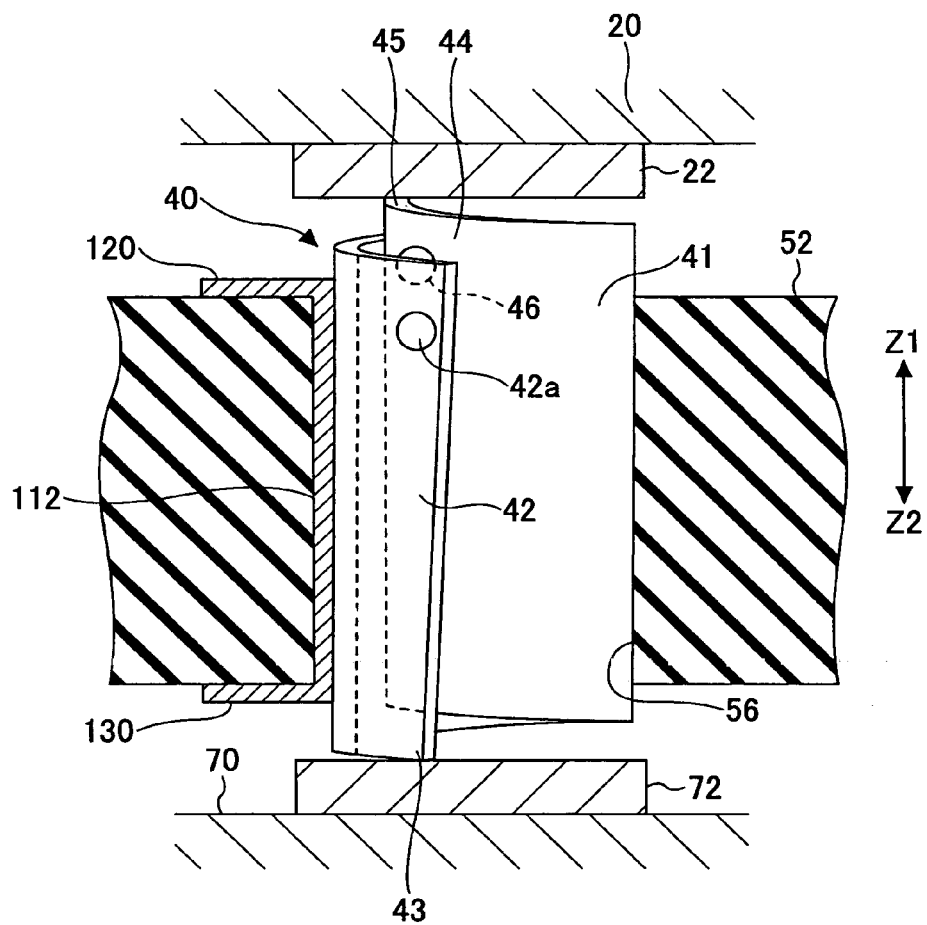
FIG. 7A is an expanded view of a modified example 2 of the first embodiment of the present invention.
Figure 7B:
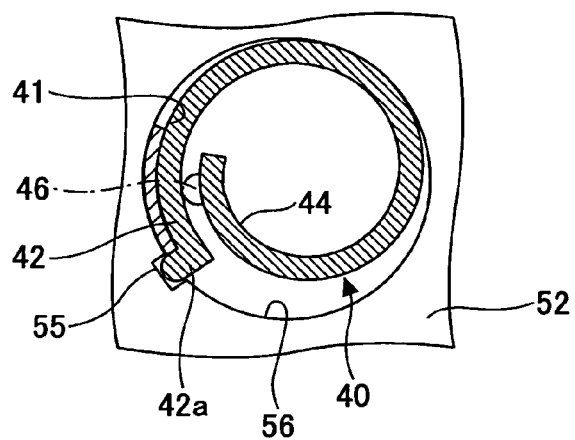
FIG. 7B is a plan view of the modified example 2 of the first embodiment of the present invention.

FIG. 7A is an expanded view of a modified example 2 of the first embodiment of the present invention. FIG. 7B is a plan view of the modified example 2 of the first embodiment of the present invention.

Referring to FIG. 7A and FIG. 7B, in the modified example 2, the conductive layer 112 extending in the Z1 and Z2 directions is formed on a part of the internal circumferential surface of the piercing hole 56. The conductive layer 112 has a designated width in the circumferential direction. The conductive layer 112 is electrically connected to the wiring pattern 120 situated at an upper surface of the base plate 52 and the wiring pattern 130 situated at a lower surface of the base plate 52.

In addition, an engaging groove 55 extending in the up and down directions is formed in the internal circumferential surface of the piercing hole 54 neighboring the conductive layer 112. The engaging groove 55 is engaged with an engaging part 42a projecting outwardly from an end part of the large diameter curved part 42. Because of this, when the engaging part 42a is engaged with the engaging groove 55, a position in the circumferential direction of the large diameter curved part 42 is fixed and movement in the circumferential direction of the large diameter curved part 42 is restricted.

The depth in the diameter direction of the engaging groove 55 is greater than a length projecting in the diameter direction of the engaging part 42a. Because of this, the large diameter curved part 42 is held in contact with the conductive layer 112.

Accordingly, when the IC package 10 is mounted on the printed wiring board 70 using the socket 50, the first contact parts 45 of the contact members 40 come in contact with the corresponding first pads 22 of the board 20. In addition, the second contact parts 43 of the contact members 40 come in contact with the second pads 72 on the printed wiring board 70. Furthermore, the top part of the projection 46 of the small diameter curved part 44 comes in contact with the internal surface of the large diameter curved part 42.

Thus, the electric conductivity between the second contact part 43 and the first contact part 45 can be established with a shortest length in the up and down directions (Z1 and Z2 directions).

In addition, the contact member 40 inserted in the piercing hole 56 of the socket 50 comes in contact with the conductive layer 112 formed on a art of the internal circumferential surface of the piercing hole 56 where the engaging part 42a of the large diameter curved part 42 is engaged with the engaging groove 55 so as to be fixed in position.

As a result of this, the contact member 40 is securely shortened along a line connecting in up and down directions the second contact part 43 of the large diameter curved part 42 to the first contact part 45 of the small diameter curved part 44. The first pads 22 of the IC chip 30 are electrically connected to the wiring patterns 120 and 130 formed at the upper surface side and the lower surface of the base plate 52.

Figure 8A:
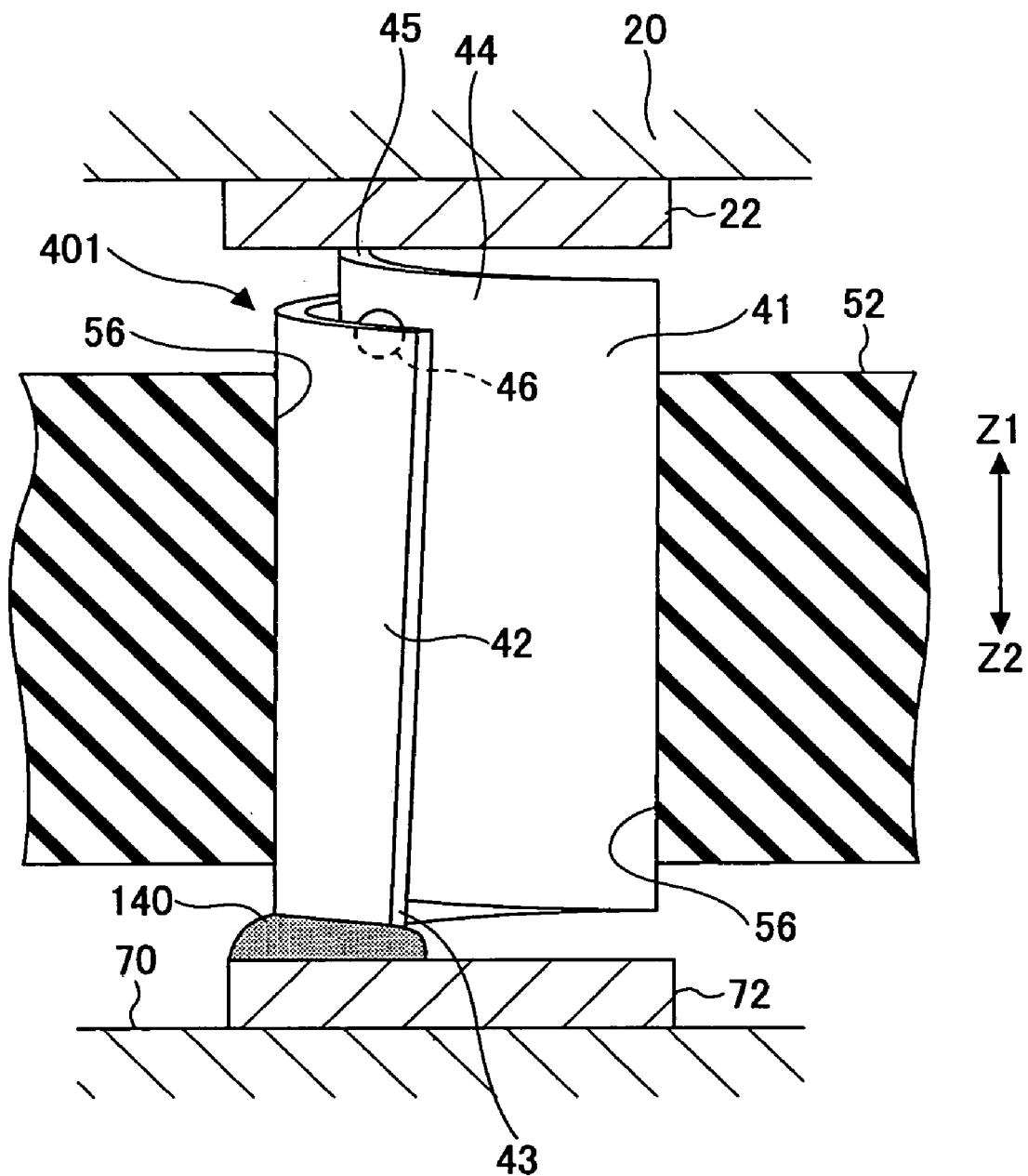
FIG. 8A is an expanded view of a modified example 3 of the first embodiment of the present invention.

FIG. 8A is an expanded view of a modified example 3 of the first embodiment of the present invention.

Referring to FIG. 8A, in a contact member 401 of a third modified example of the first embodiment of the present invention, when the IC package 10 is mounted on the printed wiring board 70 using the socket 50, solder 140 is provided in the periphery of the second contact part 43 so that the second contact part 43 and the second pad 72 are fixed to each other where the second contact part 43 of the contact member 40 comes in contact with the second pad 72 on the printed wiring board 70.

A part configured to fix the second contact part 43 and the second pad 72 to each other may be a part other than the solder 140 such as an adhesive.

With this structure, because the large diameter curved part 42 having the second contact part 43 is unified with the second pad 72 by the solder 140, it is possible to improve the connection strength and securely establish an electrical connection.

In addition, at the time of mounting, when a load is applied to the first contact part 45 of the small diameter curved part 44, the contact member 40 is securely pressed by the reaction force from the second pad 72.

As a result of this, the top part of the projection 46 of the small diameter curved part 44 comes in contact with the internal surface of the large diameter curved part 42 so that the electric conductivity between the second contact part 43 and the first contact part 45 can be established with a shortest length in the up and down directions (Z1 and Z2 directions).

Because of this, in the contact member 401, inductance at the time of mounting can be made small so that electrical loss can be reduced.

Figure 8B:
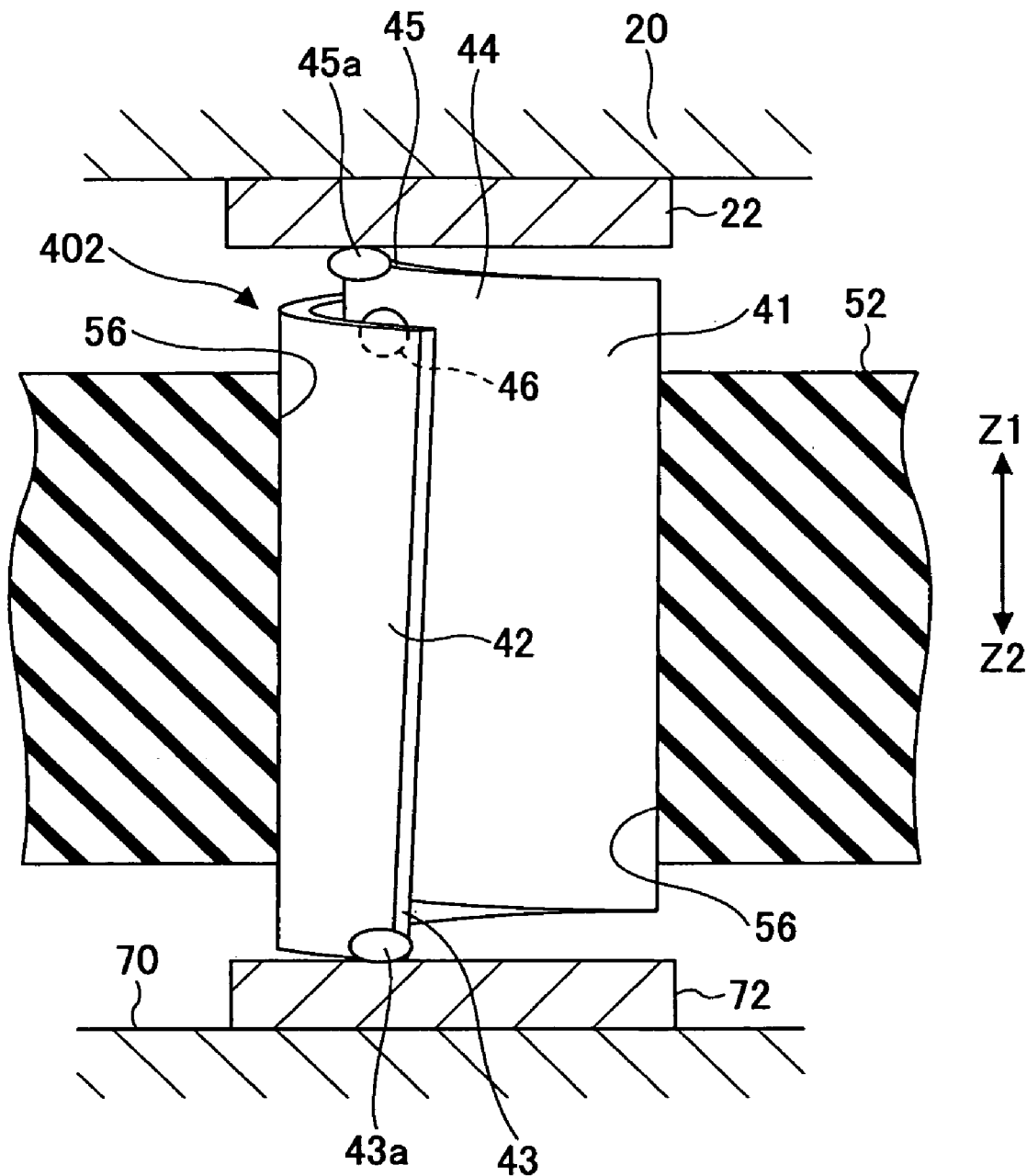
FIG. 8B is an expanded view of a modified example 4 of the first embodiment of the present invention.

FIG. 8B is an expanded view of a modified example 4 of the first embodiment of the present invention.

Referring to FIG. 8B, in a contact member 402 of the modified example 4, a projection 43a and a projection 45a are provided on the second contact part 43 and the first contact part 45, respectively. The projection 43a and the projection 45a having spherical configurations are made of conductive materials such as solder.

Because the projection 43a and the projection 45a have the spherical configurations, contact areas with the first pad 22 and the second pad 72 are expanded so that an electrical connection can be securely made.

In addition, because the projection 43a and the projection 45a are made of metal materials which are softer than the first pad 22 and the second pad 72, contact parts of the projection 43a and the projection 45a pressed to the surfaces of the first pad 22 and the second pad 72 are deformed so as to have planar configurations.

Because of this, it is possible to securely connect the first pad 22 and the second pad 72 of the contact member 402.

Figure 8C:
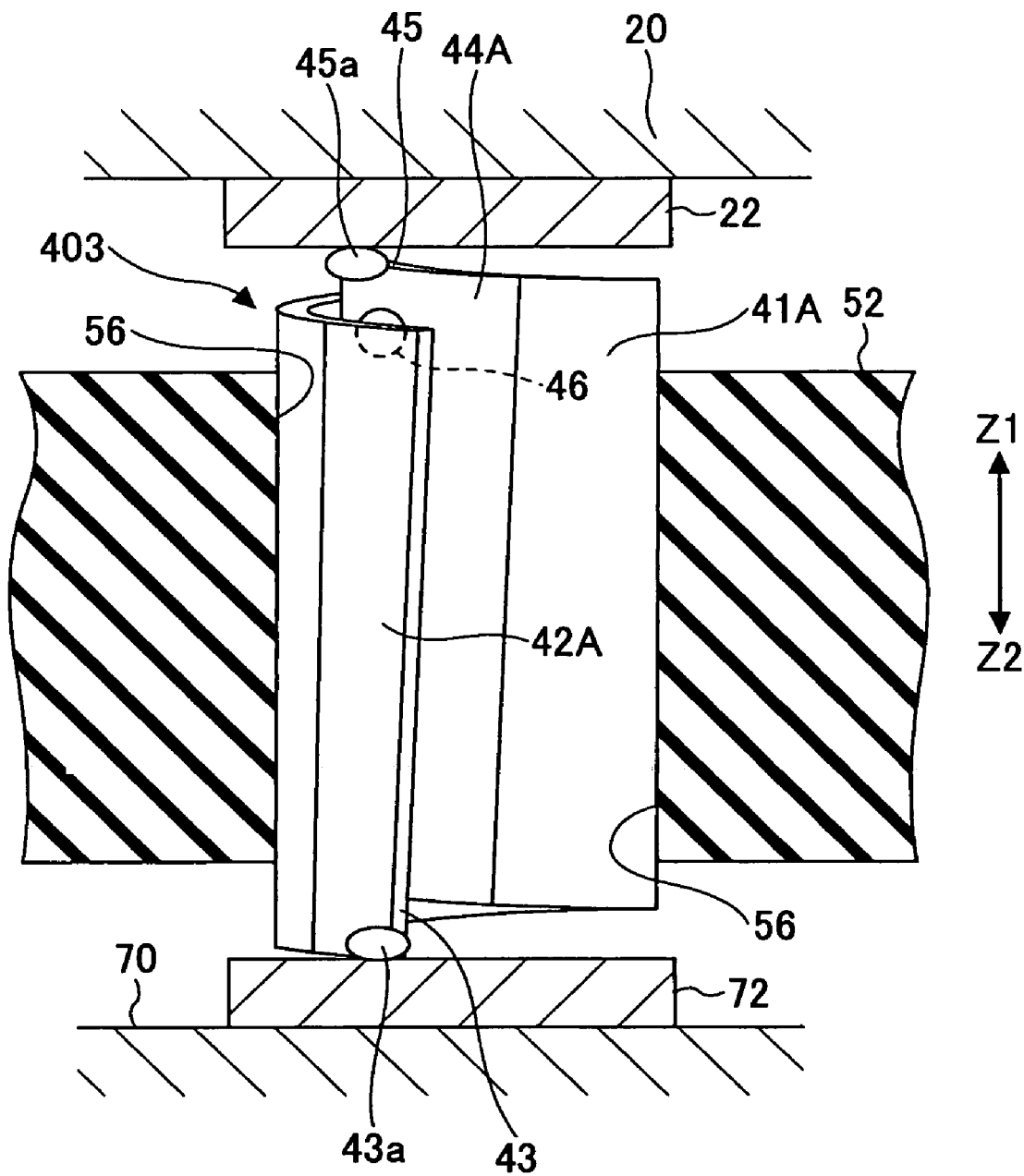
FIG. 8C is an expanded view of a modified example 5 of the first embodiment of the present invention.

FIG. 8C is an expanded view of a modified example 5 of the first embodiment of the present invention.

Referring to FIG. 8C, in a contact member 403 of the modified example 5 of the first embodiment, the spiral cylindrical part 41A is made of an insulation material having spring properties such as a resin material. A first conductive member (large diameter curved part) 42A and a second conductive member (small diameter curved part) 44A are provided at corresponding ends in the circumferential direction of the spiral cylindrical part 41A. The first conductive member (large diameter curved part) 42A is formed in a body with the second contact part 43. The second conductive member (small diameter curved part) 44A is formed in a body with the first contact part 45.

The first conductive member 42A and the second conductive member 44A are made of conductive materials such as phosphor bronze or stainless steel. The first conductive member 42A and the second conductive member 44A are curved based on radii of curvature corresponding to the large diameter curved part and the small diameter curved part.

The spiral cylindrical part 41A made of the insulation material and the first conductive member 42A and the second conductive member 44A made of the conductive material are connected in a body by an insert molding method or an adhesive, for example.

The contact member 403 is securely shortened by the projection 46 being along a line connecting in the up and down directions the second contact part 43 of the first conductive member 42A to the first contact part 45 of the second conductive member 44A to each other.

Because of this, the mounted plural first pads 22 and the corresponding second pads 72 are electrically connected to each other with shortest lengths. Here, the first pads 22 of the IC chip 30 come in contact with the second contact parts 43 formed at the upper end of the contact member 40. The second pads 72 on the printed wiring board 70 come in contact with the second contact parts 43 formed at the lower end of the contact member 40. Because of this, in the contact member 403, inductance at the time of mounting can be made small so that electrical loss can be reduced.

Second Embodiment

Figure 9:
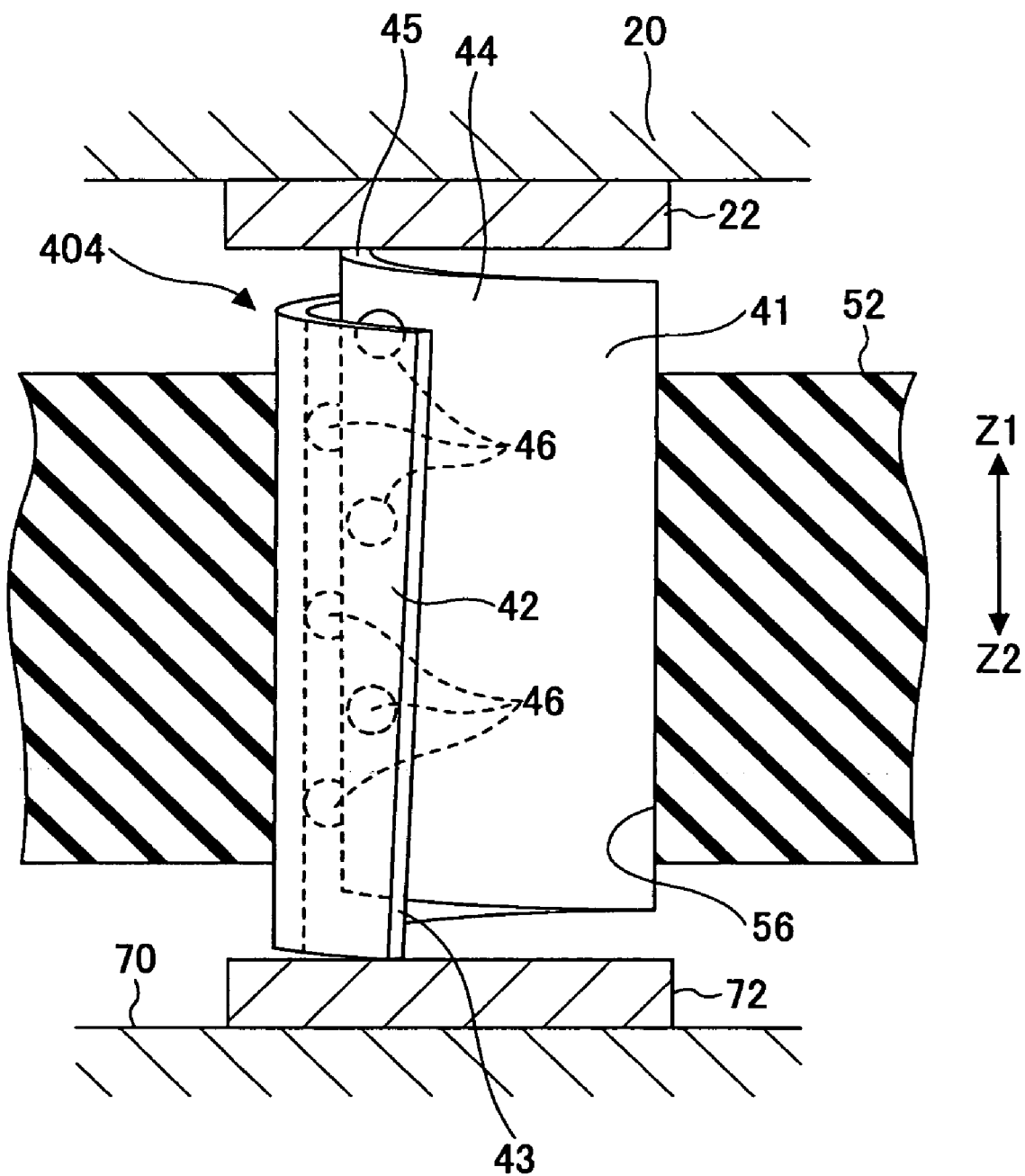
FIG. 9 is an expanded view of a second embodiment of the present invention.

FIG. 9 is an expanded view of a second embodiment of the present invention.

Referring to FIG. 9, in a contact member 404 of the second embodiment, plural projections (third contact parts) 46 project from the external circumferential part of the small diameter curved part 44. These projections 46 have hemi-spherical configurations and are provided in the up and down directions (Z1 and Z2 directions) and a circumferential direction with designated spaces.

In this example, three projections 46 are provided in the up and down directions and two lines of the projections 46 are provided in the circumferential direction. Plural projections 46 have the same diameter lengths, have the same projection heights and come in point-contact with the internal circumferential surface of the large diameter curved part 42.

When the IC package 10 is mounted on the printed wiring board 70 using the socket 50, in contact member 40 inserted in the piercing hole 56 of the socket 50, the large diameter curved part 42 and the small diameter curved part 44 are compressed in the up and down directions (Z1 and Z2 directions) by a compression load.

During a process where the spiral cylindrical part 41 is changed from being inclined to being horizontal, the small diameter part 44 goes down to the large diameter curved part 42 pressed and held by the internal circumferential surface of the piercing hole 56 and a diameter of the small diameter part 44 deforms outwardly. As a result of this, the projection 46 provided on the small diameter curved part 44 comes in point contact with the large diameter curved part 42.

Thus, even if dimensional unevenness is generated in a gap S between the large diameter curved part 42 and plural projections 46, any of the plural projections 46 can be securely brought into contact with the internal circumferential surface of the large diameter curved part 42.

The contact member 404 is securely shortened by the projections 46 along a line connecting in the up and down directions the second contact part 43 of the large diameter curved part 42 to the first contact part 45 of the small diameter curved part 44.

Because of this, the mounted plural first pads 22 and the corresponding second pads 72 are electrically connected to each other with shortest lengths. Here, the first pads 22 of the IC chip 30 come in contact with the first contact part 45 formed at the upper end of the contact member 404. The second pads 72 on the printed wiring board 70 come in contact with the second contact parts 43 formed at the lower end of the contact member 404. Because of this, in the contact member 404, inductance at the time of mounting can be made small so that electrical loss can be reduced.

Here, a manufacturing method of the above-mentioned contact member 404 is discussed with reference to FIG. 10A through FIG. 11B.

Figure 10A:
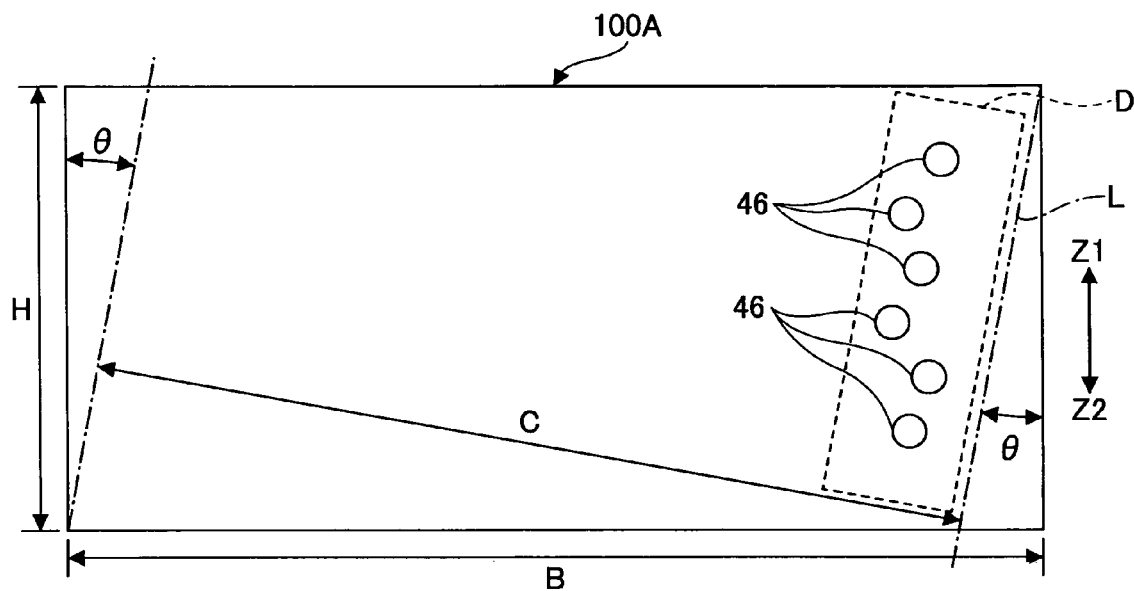
FIG. 10A is a front view showing a belt shaped member 100A where a contact member 40A is expanded.
Figure 10B:
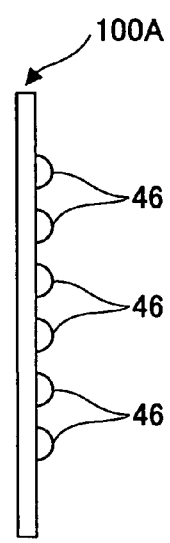
FIG. 10B is a side view of the belt shaped member 100A.
Figure 11A:
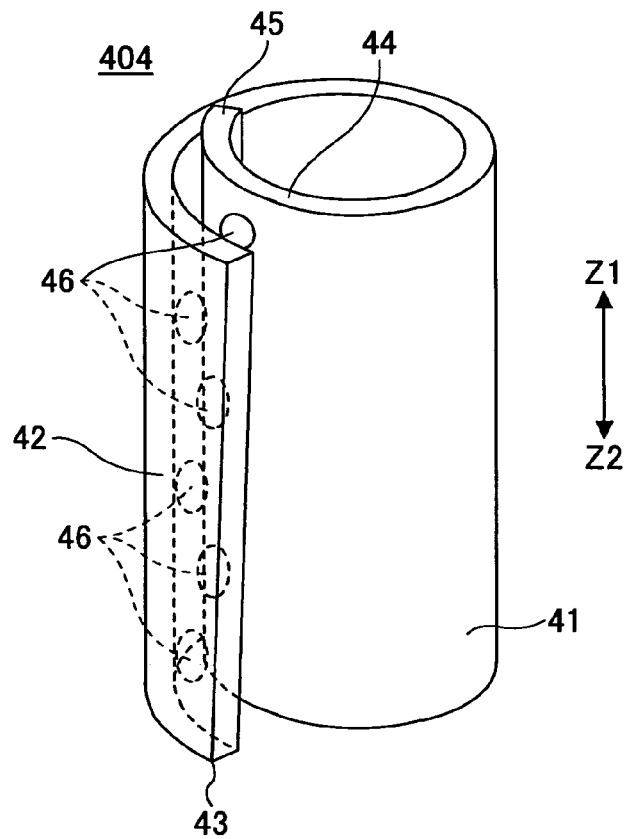
FIG. 11A is a perspective view of a curved contact member 404.
Figure 11B:
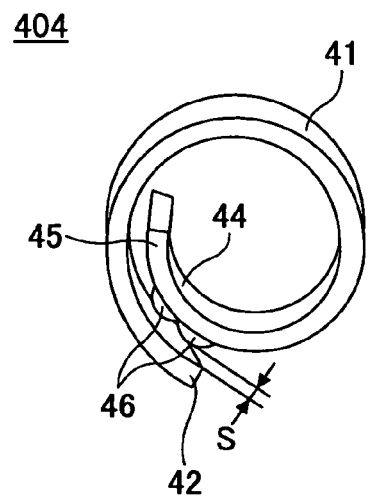
FIG. 11B is a plan view of the curved contact member 404.

FIG. 10A is a front view showing a belt shaped member 100A where a contact member 40A is expanded. FIG. 10B is a side view of the belt shaped member 100A. FIG. 11A is a perspective view of a curved contact member 404. FIG. 11B is a plan view of the curved contact member 404.

As shown in FIG. 10A and FIG. 10B, first, metal plate working is applied to a plate made of a metal material having conductivity and spring properties, such as phosphor bronze or stainless steel. Alternatively, a belt shaped metal material wound in a roll is cut into parts having designated lengths. As a result of this, the belt shaped member 100A is formed.

The height H and width B of the belt shaped member 100A are determined based on the diameter of the piercing hole 56 or the depth of the piercing hole 56 (namely, thickness of the base plate 52).

In the next step, plural projections 46 are formed on the belt shaped member 100A by a pressing process. The projections 46 have semi-spherical shaped configurations and the top of the projections 46 work as contact parts. A configuration other than the semi-spherical shaped configuration, for example, a trapezoidal shaped configuration or a conical shaped configuration, may be selected as the configuration of the projection 46.

Positions where plural projections 46 are formed are in an area D where overlapped large diameter curved part 42 and small diameter curved part 44 face each other.

The area D is a rectangular shaped area and includes a circumferential direction area and a height direction area. Here, the circumferential direction area is an area where the small diameter curved part 44 is operated in the circumferential direction with respect to the large diameter curved part 42, which is pressed and held by the internal circumferential surface of the piercing holes 56. The height direction area is an area where the small diameter part 44 moves down due to the compression load in the up and down directions. It is preferable to set the area D by considering a range of a process error.

Accordingly, the number of the projections 46 is not limited to six of this example but may be two through five or more than six. The size of the projection 46 may be properly selected so that the projections 46 are situated in the area D.

In a next step, as shown in FIG. 11A and FIG. 11B, the belt shaped member 100A is curved in a spiral manner. A process for spiraling in this example is the same as that in the first embodiment of the present invention and therefore the explanation thereof is omitted.

When the process for making the spiral is completed, gaps S are formed between top parts of the projections 46 and internal circumferential surfaces of the large diameter curved part 42. Because of this, the large diameter curved part 42 and the small diameter curved part 44 do not come in contact with each other. This gap S remains even where the contact member 404 is inserted in the piercing hole 56 of the socket 50.

Third Embodiment

Figure 12:
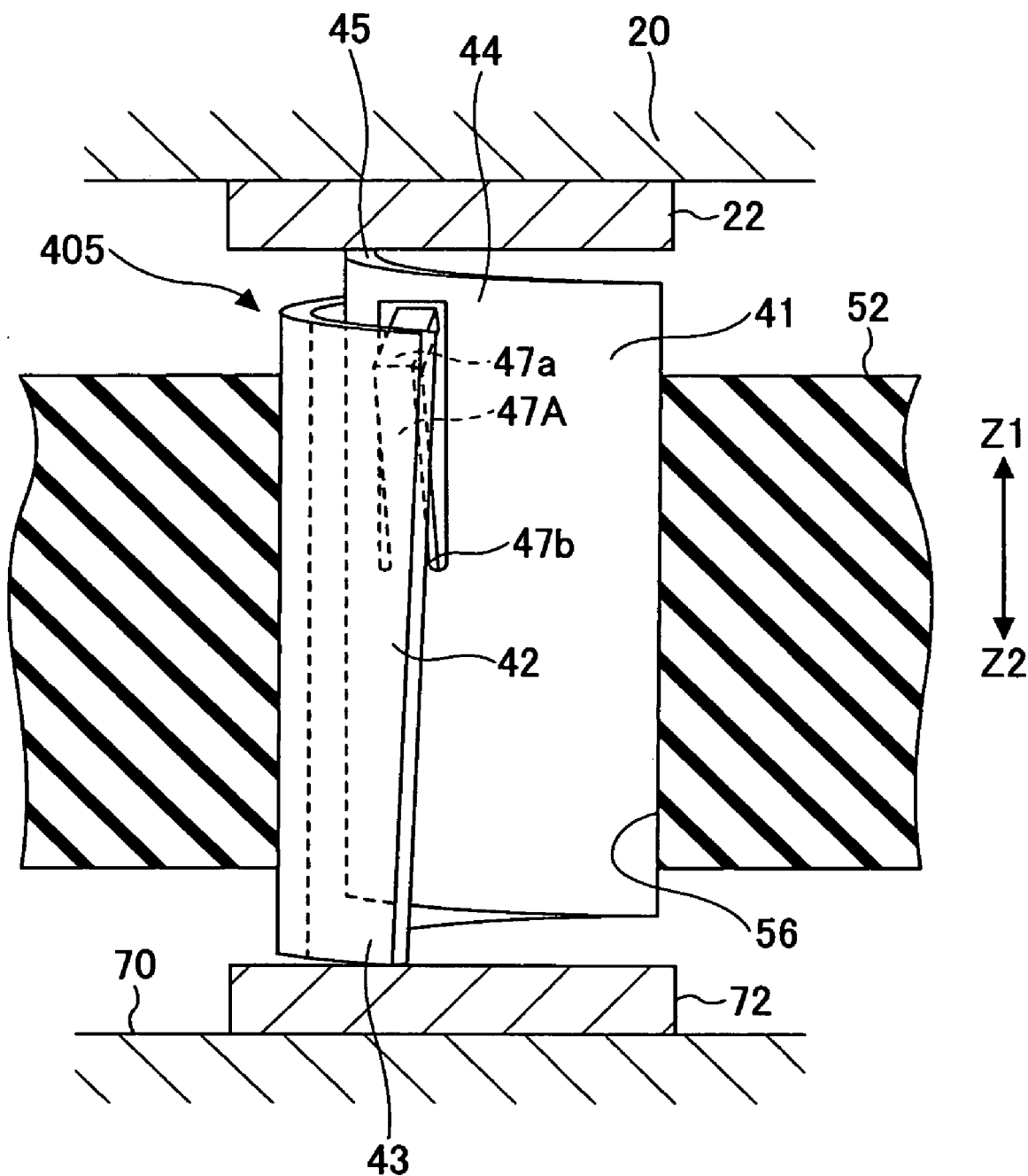
FIG. 12 is an expanded view of a third embodiment of the present invention.

FIG. 12 is an expanded view of a third embodiment of the present invention.

Referring to FIG. 12, in a contact member 405 of a third embodiment of the present invention, a contactor (third contact part) 47 projects from the external circumferential part of the small diameter curved part 44.

The contactor 47 has a plate spring shaped configuration. A head end part 47a of the contactor 47 inclines outwardly from the external circumferential part of the small diameter curved part 44.

The head end part 47a of the contactor 47 is bent and a bent part of the head end part 47a closes to the internal circumferential surface of the large diameter curved part 42.

When the IC package 10 is mounted on the printed wiring board 70 by using the socket 50, in a contact member 405 inserted in the piercing hole 56 of the socket 50, the large diameter curved part 42 and the small diameter curved part 44 are compressed in the up and down directions (Z1 and Z2 directions) by a compression load.

During a process where the spiral cylindrical part 41 is changed from being inclined to being horizontal, the small diameter part 44 goes down to the large diameter curved part 42 pressed and held by the internal circumferential surface of the piercing hole 56 and the diameter of the small diameter part 44 deforms to the outside. As a result of this, the projection 46 provided on the small diameter curved part 44 comes in point contact with the large diameter curved part 42.

Because the contactor 47 is formed by a spring having a cantilever beam structure, the head end part 47a comes in contact with the internal circumferential surface of the large diameter curved part 42 and is elastically deformed so that the spring force is transmitted to the inner circumferential surface of the large diameter curved part 42. In other words, the contactor 47 generates a pressing force in a direction where the large diameter curved part 42 and the small diameter curved part 44 are separated from each other. As a result of this, the contact pressure between the large diameter curved part 42 and the small diameter curved part 44 can be secured.

The contact member 405 is securely shortened along a line connecting in up and down directions the second contact part 43 of the large diameter curved part 42 to the first contact part 45 of the small diameter curved part 44.

Because of this, the mounted first pads 22 and the corresponding second pads 72 are electrically connected to each other with shortest lengths. Here, the first pads 22 of the IC chip 30 come in contact with the first contact part 45 formed at the upper end of the contact member 405. The second pads 72 on the printed wiring board 70 come in contact with the second contact parts 43 formed at the lower end of the contact member 405. Because of this, in the contact member 405, inductance at the time of mounting can be made small so that electrical loss can be reduced.

Because the contactor 47 has the plate spring structure, even if dimensional unevenness is formed between the large diameter curved part 42 and the contactor 47, the contactor 47 is elastically deformed in a radius direction so that the head end part 47a can securely come in contact with the internal circumferential surface of the large diameter curved part 42.

Although the contactor 47 extends in the up and down directions in this example, the present invention is not limited to this. For example, the contactor 47 may be provided in a horizontal direction (where its longitudinal direction is a circumferential direction).

Here, a manufacturing method of the above-mentioned contact member 405 is discussed with reference to FIG. 13A through FIG. 14B.

Figure 13A:
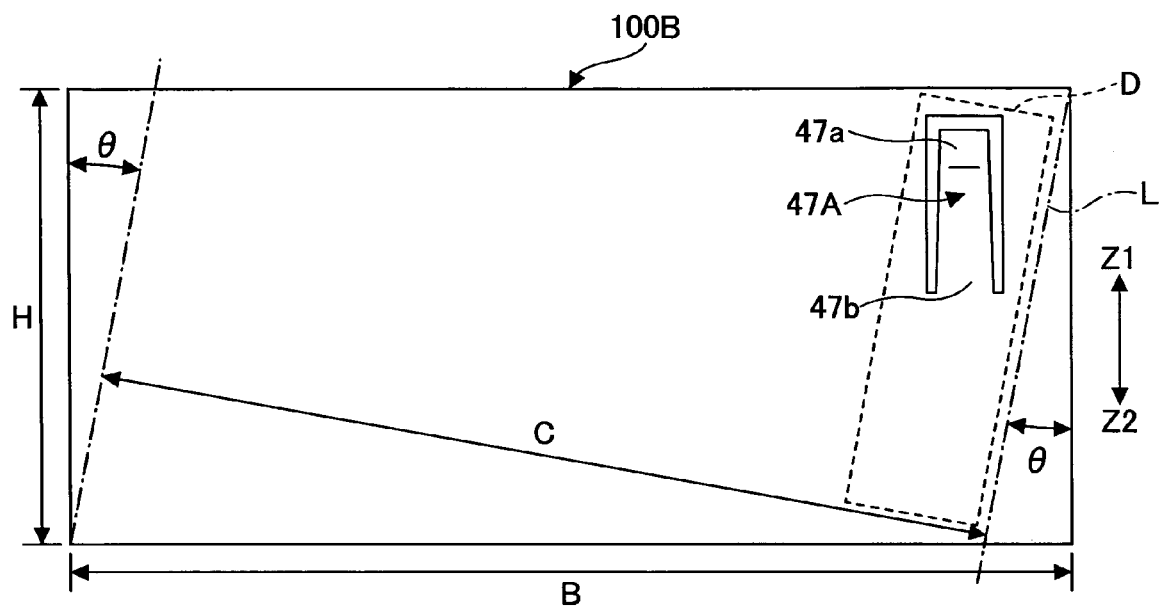
FIG. 13A is a front view showing a belt shaped member 100B where a contact member 405 is expanded.
Figure 13B:
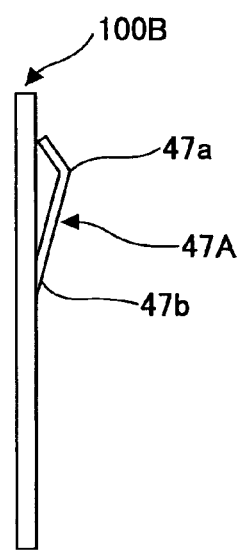
FIG. 13B is a side view of the belt shaped member 100B.
Figure 14A:
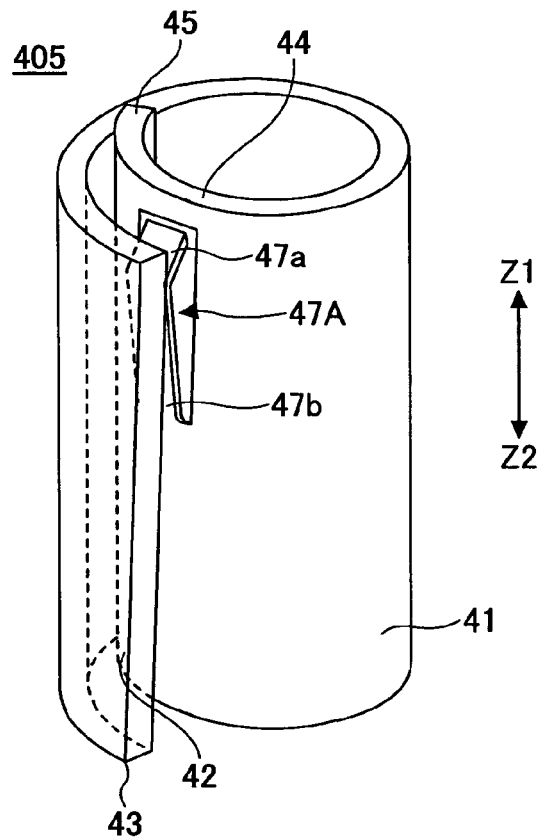
FIG. 14A is a perspective view of the curved contact member 405.
Figure 14B:
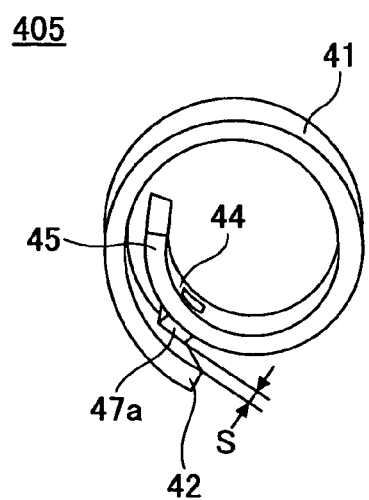
FIG. 14B is a plan view of the curved contact member 405.

FIG. 13A is a front view showing a belt shaped member 100B where a contact member 405 is expanded. FIG. 13B is a side view of the belt shaped member 100B. FIG. 14A is a perspective view of the curved contact member 405. FIG. 14B is a plan view of the curved contact member 405.

As shown in FIG. 13A and FIG. 13B, first, metal plate working is applied to a plate made of a metal material having conductivity and spring properties, such as phosphor bronze or stainless steel. Alternatively, a belt shaped metal material wound in a roll is cut into parts having designated lengths. As a result of this, the belt shaped member 100B is formed.

The height H and width B of the belt shaped member 100B are determined based on the diameter of the piercing hole 56 or the depth of the piercing hole 56 (namely, thickness of the base plate 52).

In a next step, a pressing process is applied to the belt shaped member 100B so that the contactors 47A are bent. The contactor 47 is bent where a base part 47b is inclined at a designated angle relative to the surface of the belt shaped member 100B. In addition, the contactor 47 is bent downward so that a curving part of the head end part 47a is a top part. Furthermore, the head end part 47a of the contactor 47 extends upward, namely in the Z1 direction.

A processing position of the contactor 47 is formed so as to be in the area D where the large diameter curved part 42 and the small diameter curved part 44 face each other.

In a next step, as shown in FIG. 14A and FIG. 14B, the belt shaped member 100B is curved in a spiral manner. A process for curving in this example is the same as that in the first and second embodiments of the present invention and therefore the explanation thereof is omitted.

When the process for making the spiral is completed, a gap S is formed between the head end part 47a of the connector 47 and an internal circumferential surface of the large diameter curved parts 42. Because of this, the large diameter curved part 42 and the small diameter curved part 44 do not come in contact with each other. This gap S remains even where the contact member 405 is inserted in the piercing hole 56 of the socket 50.

Here, a first modified example of the third embodiment of the present invention is discussed with reference to FIG. 15.

Figure 15:
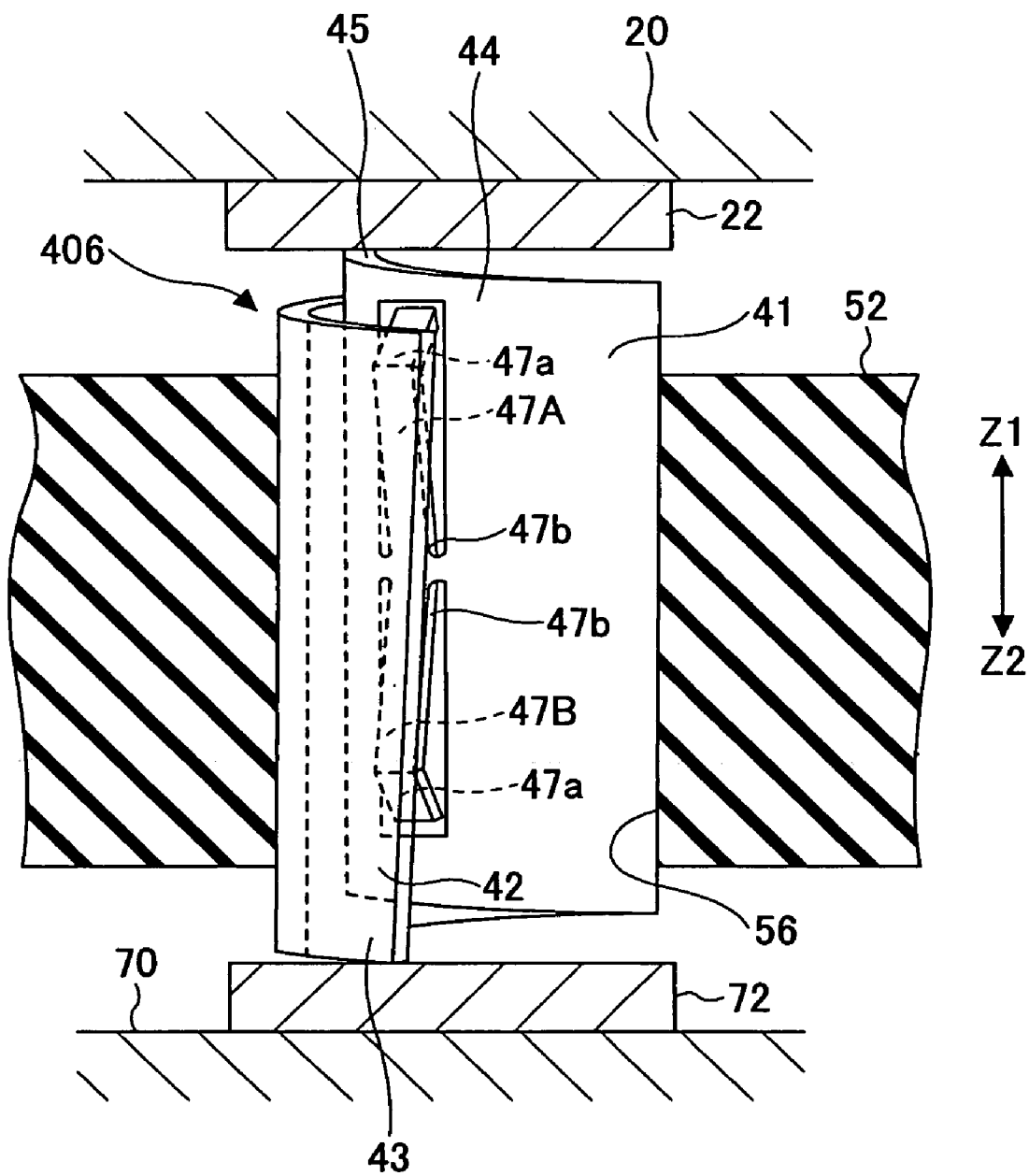
FIG. 15 is an expanded view of a first modified example of the third embodiment of the present invention.

FIG. 15 is an expanded view of the first modified example of the third embodiment of the present invention.

Referring to FIG. 15, in the contact member 406 of the first modified example of the second embodiment, a pair of contactors (third contact part) 47A and 47B project from the external circumferential surface of the small diameter curved part 44 in the up and down directions. The contactors 47A and 47B have plate spring shaped configurations. The head end part 47a inclines outside the external circumference of the small diameter curved part 44.

Although the pair of the contactors 47 is provided at the external circumference of the small diameter curved part 44 in this example, the present invention is not limited to this. For example, the contactors 47A and 47B may be provided in parallel or plural contactors 47 may be provided in a horizontal direction (where a longitudinal direction is a circumferential direction).

The contactors 47A and 47B are provided in a symmetrical manner in the up and down directions. In addition, the head end parts 47a of the contactors 47A and 47B are bent and bent parts are close to the internal circumferential surface of the large diameter curved part 42.

Because of this, even if dimensional unevenness is generated in a gap S between the large diameter curved part 42 and plural projections 46, one of the contactors 47 can securely come in contact with the internal circumferential surface of the large diameter curved part 42.

The contactors 47A and 47B generate a pressing force in a direction where the large diameter curved part 42 and the small diameter curved part 44 are separated from each other. As a result of this, the contact pressure between the large diameter curved part 42 and the small diameter curved part 44 can be secured by the contactors 47A and 47B.

The contact member 406 is securely shortened by the contactors 47A and 47B being along a line connecting in the up and down directions the second contact part 43 of the large diameter curved part 42 to the first contact part 45 of the small diameter curved part 44.

Because of this, the mounted plural first pads 22 and the corresponding second pads 72 are electrically connected to each other with shortest lengths. Here, the first pads 22 of the IC chip 30 come in contact with the second contact part 45 formed at the upper end of the contact member 406. The second pads 72 on the printed wiring board 70 come in contact with the second contact parts 43 formed at the lower end of the contact member 406. Because of this, in the contact member 406, inductance at the time of mounting can be made small so that electrical loss can be reduced.

Here, a manufacturing method of the above-mentioned contact member 406 is discussed with reference to FIG. 16A through FIG. 17B.

Figure 16A:
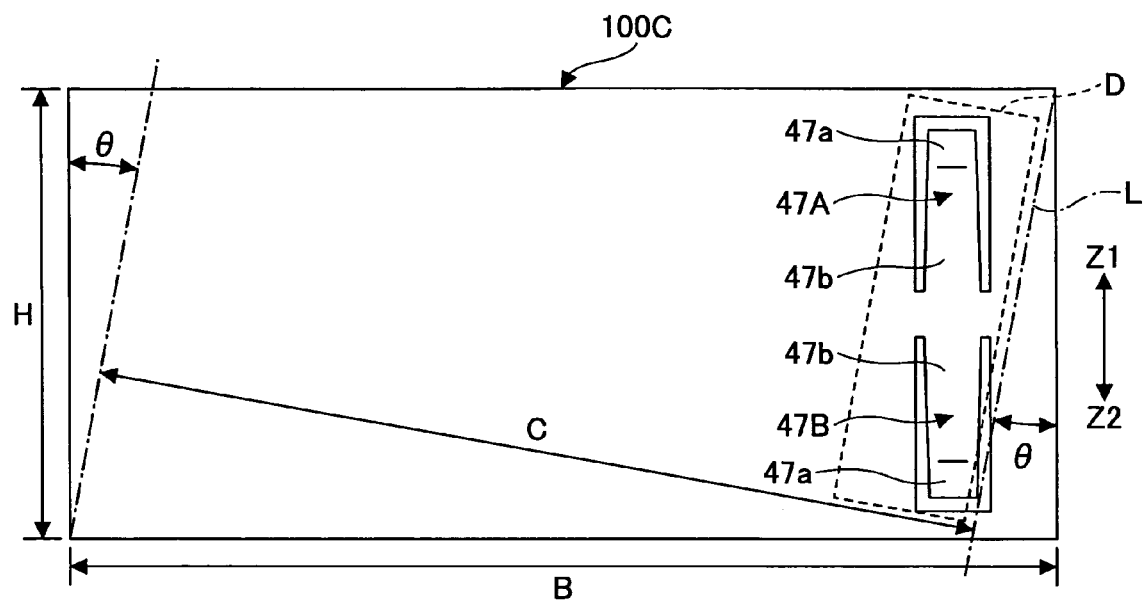
FIG. 16A is a front view showing a belt shaped member 100C where a contact member 406 is expanded.
Figure 16B:
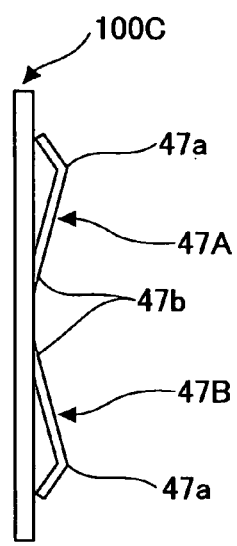
FIG. 16B is a side view of the belt shaped member 100C.
Figure 17A:
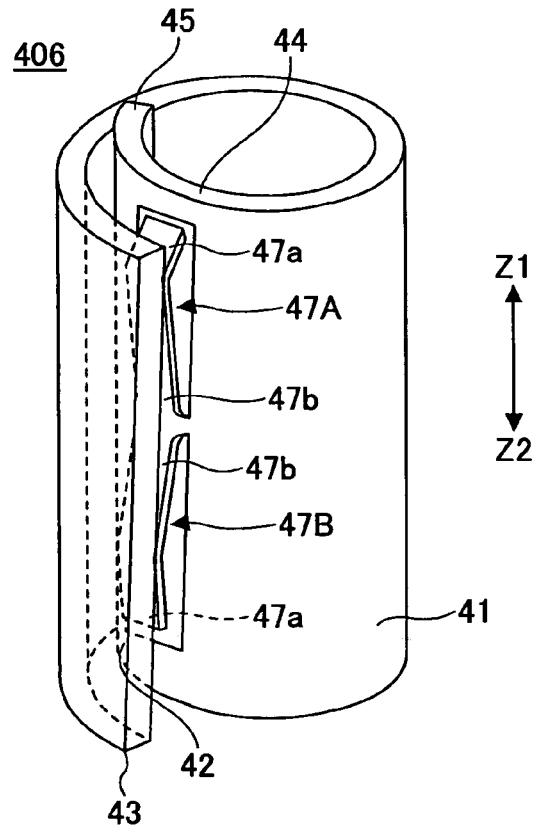
FIG. 17A is a perspective view of the curved contact member 406.
Figure 17:
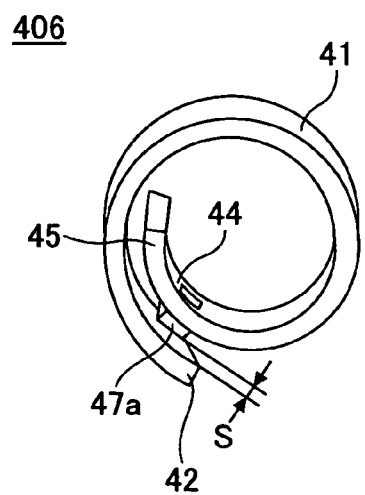
FIG. 17B is a plan view of the curved contact member 406.

FIG. 16A is a front view showing a belt shaped member 100C where the contact member 406 is expanded. FIG. 16B is a side view of the belt shaped member 100C. FIG. 17A is a perspective view of the curved contact member 406. FIG. 17B is a plan view of the curved contact member 406.

As shown in FIG. 16A and FIG. 16B, first, metal plate working is applied to a plate made of a metal material having conductivity and spring properties, such as phosphor bronze or stainless steel. Alternatively, a belt shaped metal material wound in a roll is cut into parts having designated lengths. As a result of this, the belt shaped member 100C is formed.

The height H and width B of the belt shaped member 100C are determined based on the diameter of the piercing hole 56 or the depth of the piercing hole 56 (namely, thickness of the base plate 52).

In a next step, a pressing process is applied to the belt shaped member 100C so that a pair of the contactors 47A and 47B is bent. The contactors 47A and 47B are bent where base parts 47b are inclined at designated angles relative to the surface of the belt shaped member 100C. In addition, the contactors 47A and 47B are bent downward so that a curving part of the head end parts 47a are top parts. Furthermore, the pair of the contactors 47A and 47B is arranged in the up and down directions in a line. The head end part 47a of the contactor 47A extends upward, namely in the Z1 direction. The head end part 47a of the contactor 47B extends downward, namely in the Z2 direction.

Processing positions of the contactors 47A and 47B are formed so as to be in the area D where the overlapped large diameter curved part 42 and the small diameter curved part 44 face each other.

In a next step, as shown in FIG. 17A and FIG. 17B, the belt shaped member 100C is curved in a spiral manner. A process for curving in this example is the same as that in the first embodiment of the present invention and therefore the explanation thereof is omitted.

When the process for making the spiral is completed, gaps S are formed between the head end parts 47a of the connectors 47A and 47B and an internal circumferential surface of the large diameter curved parts 42. Because of this, the large diameter curved part 42 and the small diameter curved part 44 do not come in contact with each other. This gap S remains even where the contact member 405 is inserted in the piercing hole 56 of the socket 50.

Figure 18:
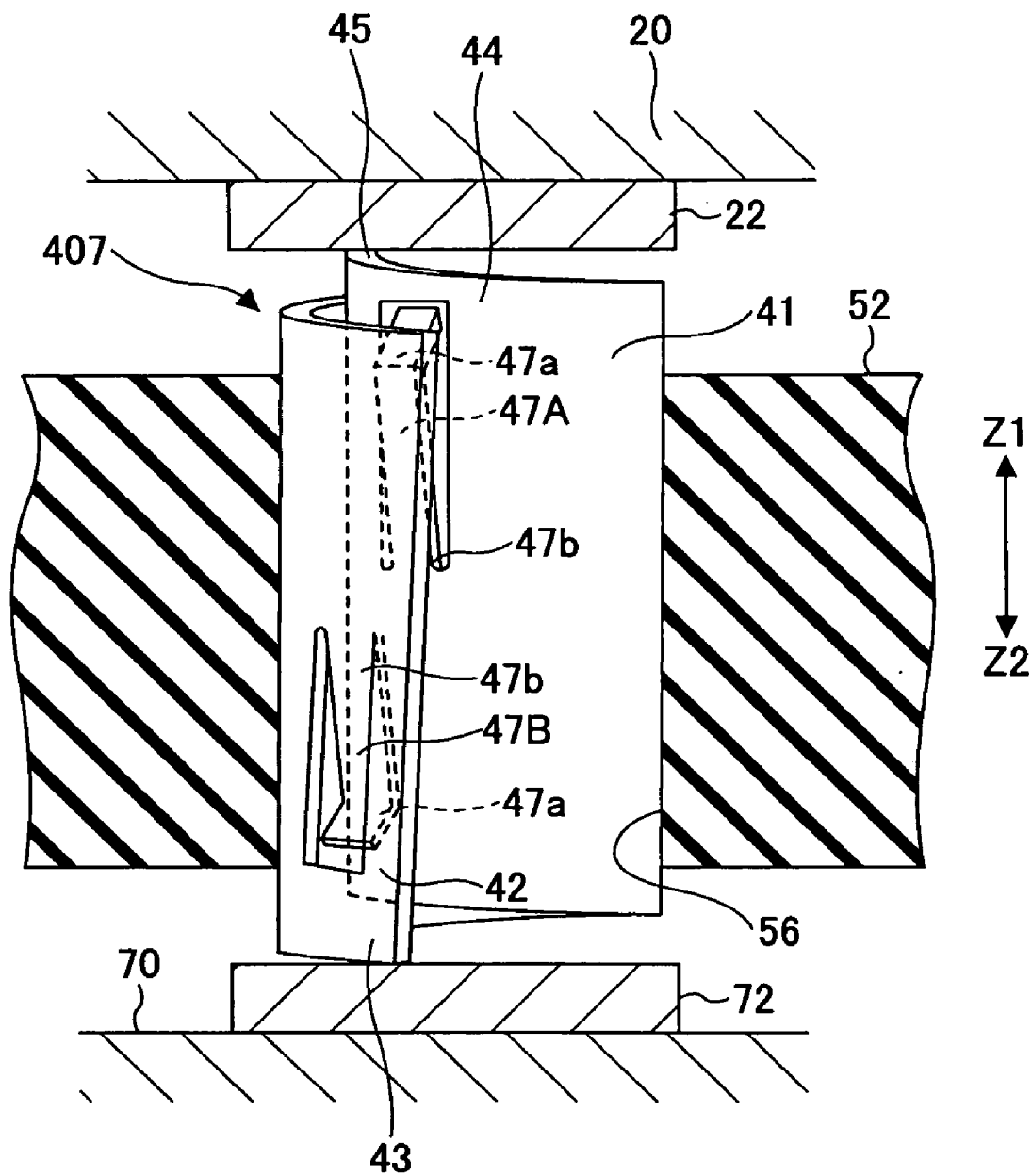
FIG. 18 is an expanded view of a second modified example of the third embodiment of the present invention.

FIG. 18 is an expanded view of a second modified example of the third embodiment of the present invention.

Referring to FIG. 18, in the contact member 407 of the second modified example of the second embodiment, the contactor 47A (third contact part) projects from the external circumferential surface of the small diameter curved part 44. The contactor 47B (third contact part) projects on an internal circumferential surface of the large diameter curved part 42 facing the external circumferential surface of the small diameter curved part 44.

The contactors 47A and 47B have plate spring shaped configurations. The head end part 47a of the contactor 47A inclines outside the external circumference of the small diameter curved part 44. The contactor 47B inclines inside the internal circumferential surface of the large diameter curved part 42.

Although one of the contactors 47 is provided at each of the small diameter curved part 44 and the large diameter curved part 42 in this example, the present invention is not limited to this. For example, the contactors 47A and 47B may be provided in parallel or plural contactors 47 may be provided in a horizontal direction (where their longitudinal direction is a circumferential direction).

The contactors 47A and 47B are provided in a symmetrical manner in the up and down directions. In addition, the head end parts 47a of the contactors 47A and 47B are bent and bent parts are close to the internal circumferential surface of the large diameter curved part 42.

Because of this, even if dimensional unevenness is generated in a gap S between the large diameter curved part 42 and the small diameter curved part 44, one of the contactors 47 can securely come in contact with the internal circumferential surface of the large diameter curved part 42.

The contactors 47A and 47B generate a pressing force in a direction where the large diameter curved part 42 and the small diameter curved part 44 are separated from each other. As a result of this, the contact pressure between the large diameter curved part 42 and the small diameter curved part 44 can be secured by the contactors 47A and 47B.

The contact member 407 is securely shortened by the contactors 47A and 47B being along a line connecting in the up and down directions the second contact part 43 of the large diameter curved part 42 to the first contact part 45 of the small diameter curved part 44.

Because of this, the mounted plural first pads 22 and the corresponding second pads 72 are electrically connected to each other with shortest lengths. Here, the first pads 22 of the IC chip 30 come in contact with the first contact part 45 formed at the upper ends of the contact members 406. The second pads 72 on the printed wiring board 70 come in contact with the second contact parts 43 formed at the lower ends of the contact members 407. Because of this, in the contact members 407, inductance at the time of mounting can be made small so that electrical loss can be reduced.

Here, a manufacturing method of the above-mentioned contact member 407 is discussed with reference to FIG. 19A through FIG. 20B.

Figure 19A:
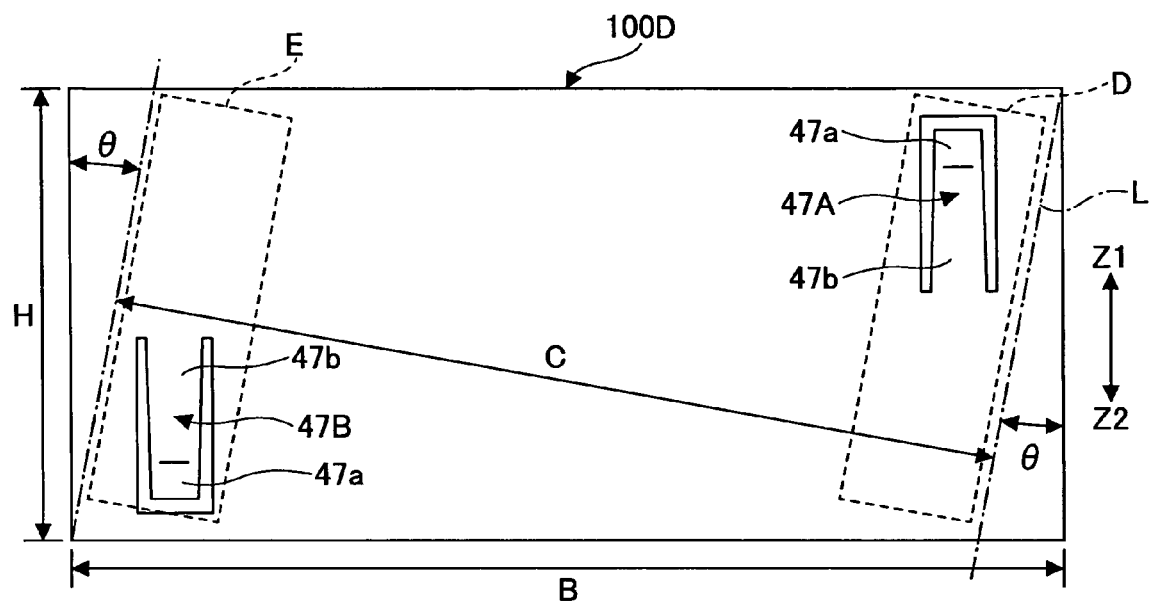
FIG. 19A is a front view showing a belt shaped member 100D where a contact member 407 is expanded.
Figure 19B:
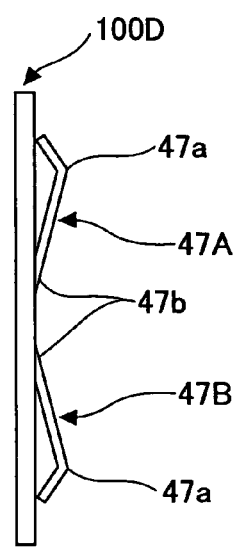
FIG. 19B is a side view of the belt shaped member 100D.
Figure 20A:
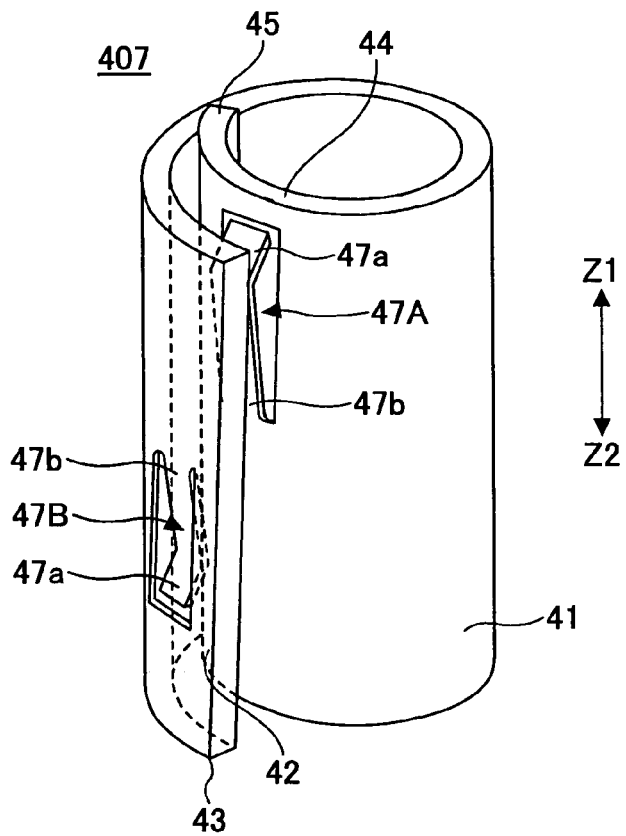
FIG. 20A is a perspective view of the curved contact member 407.
Figure 20B:
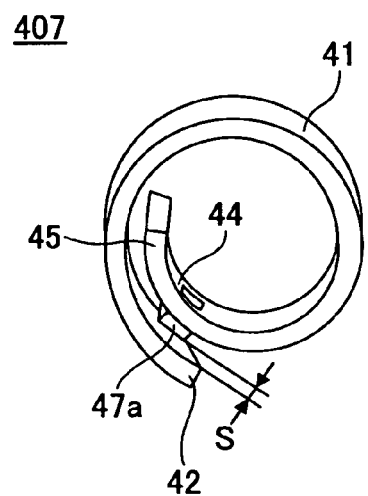
FIG. 20B is a plan view of the curved contact member 407.

FIG. 19A is a front view showing a belt shaped member 100D where a contact member 407 is expanded. FIG. 19B is a side view of the belt shaped member 100D. FIG. 20A is a perspective view of the curved contact member 407. FIG. 20B is a plan view of the curved contact member 407.

As shown in FIG. 19A and FIG. 19B, first, metal plate working is applied to a plate made of a metal material having conductivity and spring properties, such as phosphor bronze or stainless steel. Alternatively, a belt shaped metal material wound in a roll is cut into parts having designated lengths. As a result of this, the belt shaped member 100D is formed.

The height H and width B of the belt shaped member 100D are determined based on the diameter of the piercing hole 56 or the depth of the piercing hole 56 (namely, thickness of the base plate 52).

In a next step, a pressing process is applied to the belt shaped member 100D so that a pair of the contactors 47A and 47B is bent. The contactors 47A and 47B are bent where base parts 47b are inclined at designated angles relative to the surface of the belt shaped member 100D. In addition, the contactor 47A is bent upward and the contactor 47B is bent downward. The head end part 47a of the contactor 47A extends upward, namely in the Z1 direction. The head end part 47a of the contactor 47B extends downward, namely in the Z2 direction.

Processing positions of the contactors 47A and 47B are formed so as to be in the area D where the overlapped large diameter curved part 42 and the small diameter curved part 44 face each other.

In a next step, as shown in FIG. 17A and FIG. 17B, the belt shaped member 100C is curved in a spiral manner. A process for curving in this example is the same as that in the first embodiment of the present invention and therefore the explanation thereof is omitted.

When the process for making the spiral is completed, gaps S are formed between the head end parts 47a of the connectors 47A and 47B and an internal circumferential surface of the large diameter curved parts 42. Because of this, the large diameter curved part 42 and the small diameter curved part 44 do not come in contact with each other. This gap S remains even where the contact member 405 is inserted in the piercing hole 56 of the socket 50.

Figure 21:
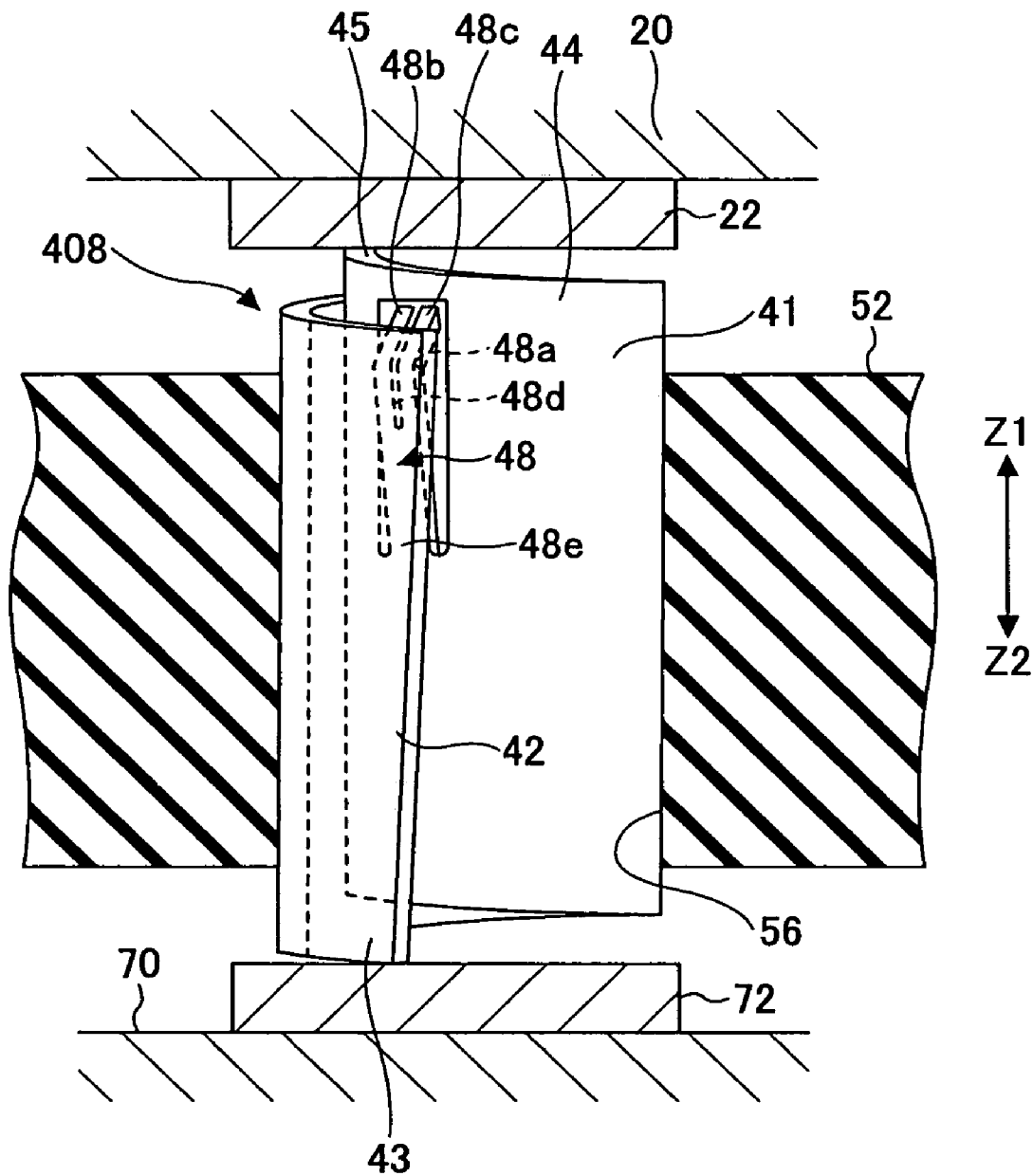
FIG. 21 is an expanded view of a third modified example of the third embodiment of the present invention.

FIG. 21 is an expanded view of a third modified example of the third embodiment of the present invention.

Referring to FIG. 21, in a contact member 408 of the third modified example of the second embodiment, a contactor (third contact part) 48 projects from the external circumference of the small diameter curved part 44. This contactor 48 has a plate spring configuration. The head end part 48a of the contactor 48 is inclined to the outside of the external circumference of the small diameter curved part 44.

In addition, a pair of contact pieces 48b and 48c extending in parallel are provided at the head end part 48a. The contact pieces 48b and 48c are divided by a center groove 48d of the head end part 48a and can generate the spring force to the large diameter curved part 42.

The contact member 408 is securely shortened by the contactor 48 being along a line connecting in the up and down directions the second contact part 43 of the large diameter curved part 42 to the first contact part 45 of the small diameter curved part 44.

Because of this, the mounted plural first pads 22 and the corresponding second pads 72 are electrically connected to each other with shortest lengths. Here, the first pads 22 of the IC chip 30 come in contact with the first contact part 45 formed at the upper end of the contact member 408. The second pads 72 on the printed wiring board 70 come in contact with the second contact parts 43 formed at the lower end of the contact member 408. Because of this, in the contact member 408, inductance at the time of mounting can be made small so that electrical loss can be reduced.

Although a pair of the contact pieces 48b and 48c is provided in this example, the present invention is not limited to this. For example, the contact pieces may be provided in parallel or plural contactors 48 and the pair of the contact pieces 48b and 48c may be provided in a horizontal direction (where its longitudinal direction is a circumferential direction).

Here, a manufacturing method of the above-mentioned contact member 408 is discussed with reference to FIG. 22A through FIG. 22B.

Figure 22A:
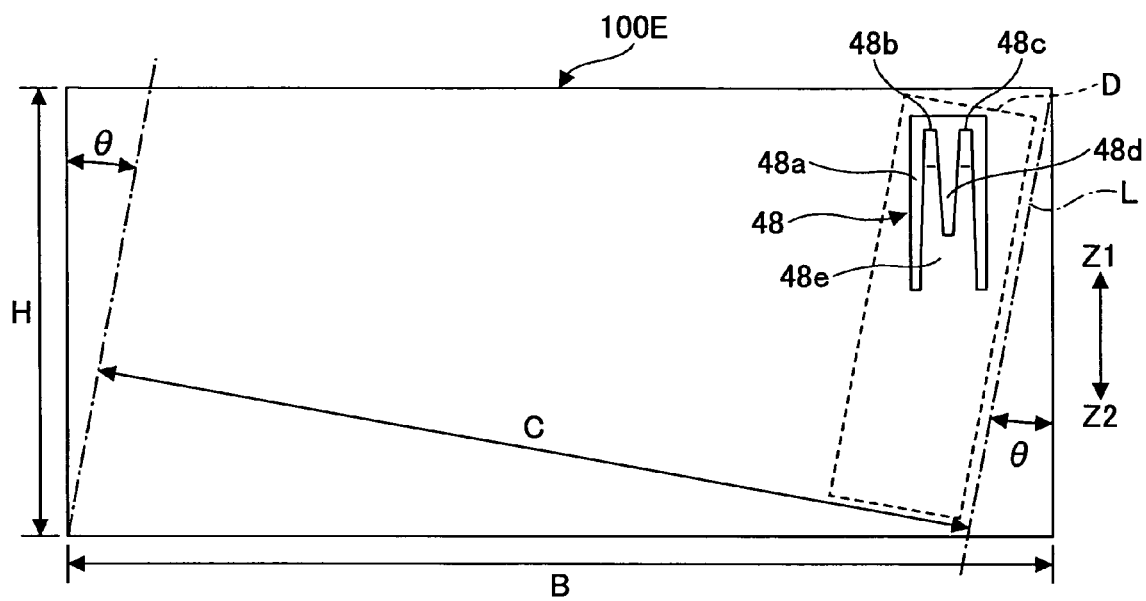
FIG. 22A is a front view showing a belt shaped member 100E where a contact member 408 is expanded.

FIG. 22A is a front view showing a belt shaped member 100E where the contact member 408 is expanded. FIG. 22B is a side view of the belt shaped member 100E. FIG. 23A is a perspective view of the curved contact member 408. FIG. 23B is a plan view of the curved contact member 408.

Figure 22B:
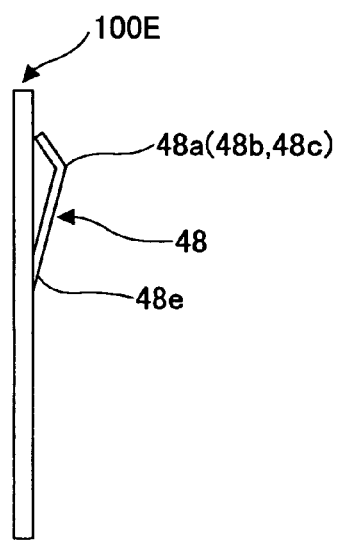
FIG. 22B is a side view of the belt shaped member 100E.
Figure 23A:
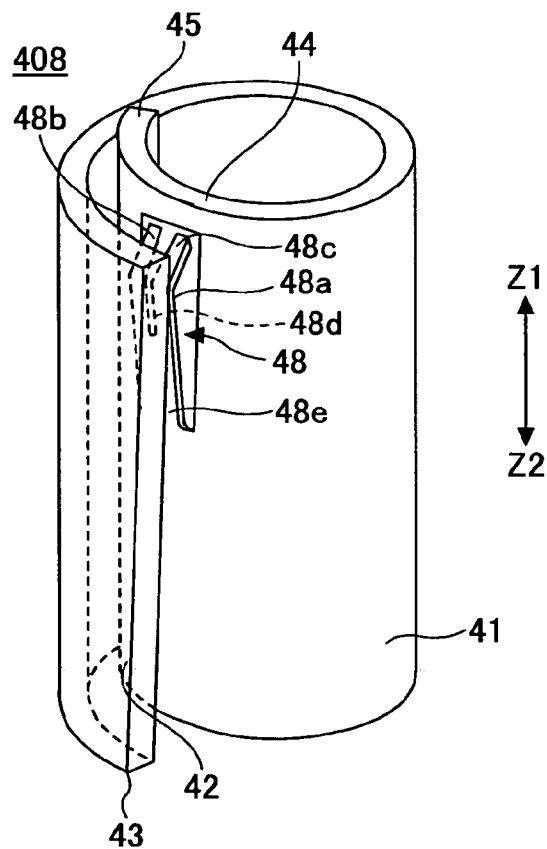
FIG. 23A is a perspective view of the curved contact member 408.
Figure 23B:
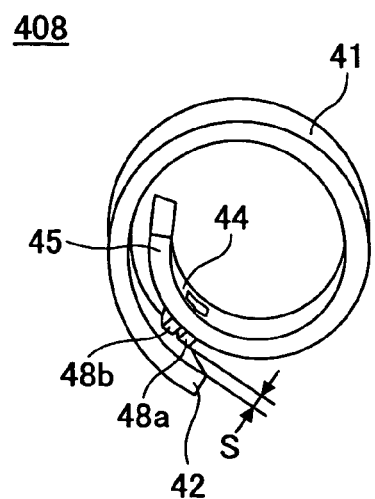
FIG. 23B is a plan view of the curved contact member 408.

As shown in FIG. 22A and FIG. 22B, first, a punching process is applied to a plate made of a metal material having conductivity and spring properties, such as phosphor bronze or stainless steel. Alternatively, a belt shaped metal material wound in a roll is cut into parts having designated lengths. As a result of this, the belt shaped member 100E is formed.

The height H and width B of the belt shaped member 100E are determined based on the diameter of the piercing hole 56 or the depth of the piercing hole 56 (namely, thickness of the base plate 52).

In a next step, a pressing process is applied to the belt shaped member 100E so that a pair of the contactors 48 is bent. The contactors 48 are bent where base parts 48e are inclined at designated angles relative to the surface of the belt shaped member 100E. In addition, the contactors 48 are bent downward so that curving parts of the head end parts 48a are top parts. Furthermore, in this example, the head end part 48a of the contactor 48 extends upward, namely in the Z1 direction.

In addition, a center groove 48d extending in the longitudinal direction (up and down direction) is formed at the head end part 48a of the contactor 48. The center groove 48d may be formed by pressing or a process after pressing applied.

Processing positions of the contactors 48 are formed so as to be in the area D where the overlapped large diameter curved part 42 and the small diameter curved part 44 face each other.

In a next step, as shown in FIG. 23A and FIG. 23B, the belt shaped member 100E is curved in a spiral manner. A process for curving in this example is the same as that in the first embodiment of the present invention and therefore the explanation thereof is omitted.

When the process for making the spiral is completed, gaps S are formed between the connector pieces 48b and 48c of the contactors 48 and an internal circumferential surface of the large diameter curved parts 42. Because of this, the large diameter curved part 42 and the small diameter curved part 44 do not come in contact with each other. This gap S remains even where the contact member 405 is inserted in the piercing hole 56 of the socket 50.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

For example, in the above-discussed examples, although the contact member 40 used for the socket 50 for mounting the IC package 10 on the printed wiring board 70 is discussed, the present invention is not limited to this. The present invention can include other devices where two connected members having electrode pads are electrically connected to each other.

This patent application is based on Japanese Priority Patent Application No. 2007-338000 filed on Dec. 27, 2007, the entire contents of which are hereby incorporated herein by reference.

What is claimed is:

1. A contact member inserted in a piercing hole of a socket provided between a first connected member and a second connected member facing each other, the contact member comprising:
    a first contact part configured to come in contact with a first pad formed in the first connected member;
    a second contact part configured to come in contact with a second pad formed in the second connected member; and
    a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part, the spiral cylindrical part having an external circumferential surface coming in contact with an inside wall of the piercing hole;
    wherein a compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length;
    the spiral cylindrical part includes a third contact part provided on least one of a part of the large diameter curved part and a part of the small diameter curved part;
    the large diameter curved part and the small diameter curved part face each other; and
    the third contact part has a contact portion formed as a hemispherical surface shaped projection part.

2. The contact member as claimed in claim 1, wherein the third contact part has a plate spring shaped configuration and generates a spring force whereby the small diameter curved part and the large diameter curved part are separated from each other.

3. The contact member as claimed in claim 1, wherein one of the first contact part and the second contact part is fixed to the first pad or the second pad.

4. The contact member as claimed in claim 1, wherein a conductive layer is formed on an internal circumferential surface of the piercing hole; and
    the compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad or the second pad and the conductive layer are electrically connected to each other.

5. The contact member as claimed in claim 1, wherein the first connected member is an IC package; and the second connected member is a printed wiring board on which the IC package is mounted.

6. A contact member inserted in a piercing hole of a socket provided between a first connected member and a second connected member facing each other, the contact member comprising:
    a first contact part configured to come in contact with a first pad formed in the first connected member;
    a second contact part configured to come in contact with a second pad formed in the second connected member;
    a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part, the spiral cylindrical part having an external circumferential surface coming in contact with an inside wall of the piercing hole;
    a first conductive member formed in a body with the first contact part; and
    a second conductive member formed in a body with the second contact part,
    wherein a compression load in the axial line direction is applied to the first contact part and the second contact part so that the small diameter curved part situated inside the spiral cylindrical part is deformed outwardly and comes in contact with the large diameter curved part situated outside the small diameter curved part and thereby the first pad and the second pad are electrically connected to each other with a shortest length;
    the spiral cylindrical part is made of an insulation material and connects the first conductive member and the second conductive member; and
    the compression load in the axial line direction is applied to the first contact part and the second contact part so that one of the first conductive member and the second conductive member, situated inside, is deformed outwardly and comes in contact with the other of the first conductive member and the second conductive member, and thereby the first pad and the second pad are electrically connected to each other with the shortest length.

7. The contact member as claimed in claim 6, wherein a third contact part is provided on at least one of a part of the first conductive member and a part of the second conductive member, and
    the large diameter part and the small diameter curved part face each other.

8. The contact member as claimed in claim 6, wherein the spiral cylindrical part has an elastic force whereby a diameter of the large diameter curved part is expanded outside and the large diameter curved part is pressed against an inside wall of the piercing hole.

9. A contact member inserted in a piercing hole of a socket provided between a first connected member and a second connected member facing each other, the contact member comprising:
    a first contact part configured to come in contact with a first pad formed in the first connected member;
    a second contact part configured to come in contact with a second pad formed in the second connected member; and
    a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part, the spiral cylindrical part having an external circumferential surface coming in contact with an inside wall of the piercing hole;

wherein a compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length; and spherical shaped projections are provided at an end part of the first contact part and an end part of the second contact part

10. A connecting method for a contact member, the contact member including a first contact part configured to come in contact with a first pad formed in a first connected member, the first contact part provided at a large diameter curved part;

a second contact part configured to come in contact with a second pad formed in a second connected member, the second contact part provided at a small diameter curved part; and a spiral cylindrical part formed in a spiral manner with respect to an axial line connecting the first contact part and the second contact part, the spiral cylindrical part having one end configured to hold the first contact part, another end configured to hold the second contact part, and an external circumferential surface coming in contact with an inside wall of a piercing hole of a socket;

wherein the spiral cylindrical part includes a third contact part provided on least one of a part of the large diameter curved part and a part of the small diameter curved part;

the large curved diameter part and the small diameter curved part face each other; and the third contact part has a contact portion formed as a hemispherical surface shaped projection part, the connecting method comprising:

a step of inserting the spiral cylindrical part into the piercing hole of the socket so that the external circumferential surface of the spiral cylindrical part comes in contact with the inside wall of the piercing hole, the first contact part projects at one side of the socket, and the second contact part projects at another side of the socket;

a step of making the first contact part come in contact with the first pad formed in the first connected member;

a step of making the second contact part come in contact with the second pad formed in the second connected member; and a step of applying a compression load in the axial line direction to the first contact part and the second contact part so that the small diameter curved part situated inside the spiral cylindrical part is deformed outwardly and comes in contact with the large diameter curved part situated outside the small diameter curved part and the third contact part comes in point contact with one of the large diameter curved part and the small diameter curved part, and thereby the first pad and the second pad are electrically connected to each other with a shortest length.

11. A socket provided between a first connected member and a second connected member facing each other, the socket having a piercing hole where a contact member is inserted, the piercing hole piercing between the first connected member and the second connected member, the contact member comprising:

a first contact part configured to come in contact with a first pad formed in the first connected member;

a second contact part configured to come in contact with a second pad formed in the second connected member; and a spiral cylindrical part formed in a spiral manner with respect to an axial line connecting the first pad and the second pad, the spiral cylindrical part having one end formed in a large diameter curved part having the first contact part, the spiral cylindrical part having another end formed in a small diameter curved part having the second contact part; the spiral cylindrical part having an external circumferential surface coming in contact with an inside wall of the piercing hole;

wherein a compression load in the axial line direction is applied to the first contact part and the second contact part so that the small diameter curved part situated inside the spiral cylindrical part is deformed outwardly and comes in contact with the large diameter curved part situated outside the small diameter curved part, and thereby the first pad and the second pad are electrically connected to each other with a shortest length;

the spiral cylindrical part includes a third contact part provided on least one of a part of the large diameter curved part and part of the small diameter curved part;

the large diameter curved part and the small diameter curved part face each other; and the third contact part has a contact portion formed as a hemispherical surface shaped projection part.

* * * * *